(12) United States Patent
Vincent et al.

(10) Patent No.: US 9,036,363 B2
(45) Date of Patent: May 19, 2015

(54) DEVICES AND STACKED MICROELECTRONIC PACKAGES WITH PARALLEL CONDUCTORS AND INTRA-CONDUCTOR ISOLATOR STRUCTURES AND METHODS OF THEIR FABRICATION

(71) Applicants: Michael B. Vincent, Chandler, AZ (US); Zhiwei Gong, Chandler, AZ (US)

(72) Inventors: Michael B. Vincent, Chandler, AZ (US); Zhiwei Gong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 66 days.

(21) Appl. No.: 14/042,623

(22) Filed: Sep. 30, 2013

(65) Prior Publication Data
US 2015/0092372 A1     Apr. 2, 2015

(51) Int. Cl.
| | |
|---|---|
| H05K 7/00 | (2006.01) |
| H05K 1/11 | (2006.01) |
| H05K 1/18 | (2006.01) |
| H05K 3/10 | (2006.01) |
| H05K 3/32 | (2006.01) |

(52) U.S. Cl.
CPC ............... *H05K 1/111* (2013.01); *H05K 1/181* (2013.01); *H05K 3/10* (2013.01); *H05K 3/321* (2013.01); *H05K 2201/10515* (2013.01)

(58) Field of Classification Search
USPC ......................................... 361/767, 752, 808
See application file for complete search history.

(56) References Cited

U.S. PATENT DOCUMENTS

| | | |
|---|---|---|
| 4,866,501 A | 9/1989 | Shanefield |
| 5,019,946 A | 5/1991 | Eichelberger et al. |
| 5,279,991 A | 1/1994 | Minahan et al. |
| 5,432,729 A | 7/1995 | Carson et al. |
| 5,465,186 A | 11/1995 | Bajorek et al. |
| 5,675,180 A | 10/1997 | Pedersen et al. |
| 5,847,448 A | 12/1998 | Val et al. |
| 5,977,640 A | 11/1999 | Bertin et al. |
| 6,467,880 B2 | 10/2002 | Rhodes |
| 6,560,109 B2 | 5/2003 | Yamaguchi et al. |
| 6,607,941 B2 | 8/2003 | Prabhu et al. |
| 6,818,977 B2 | 11/2004 | Poo et al. |

(Continued)

OTHER PUBLICATIONS

Rabaey, J. et al., "Digital Integrated Circuits," Jan. 2003, Pearson Education, 2nd Ed. 38-40.

(Continued)

*Primary Examiner* — Andargie M Aychillhum
(74) *Attorney, Agent, or Firm* — Sherry W. Schumm

(57) ABSTRACT

Embodiments of devices and methods of their manufacture include coupling first and second package surface conductors to a package surface with an intra-conductor insulating structure between the package surface conductors. The package surface conductors extend between and electrically couple sets of pads that are exposed at the package surface. Elongated portions of the package surface conductors are parallel with and adjacent to each other. The intra-conductor insulating structure is coupled between the package surface conductors along an entirety of the parallel and adjacent elongated portions, and the intra-conductor insulating structure electrically insulates the elongated portions of the package surface conductors from each other. Some embodiments may be implemented in conjunction with a stacked microelectronic package that includes sidewall conductors and an intra-conductor insulating structure between and electrically insulating the sidewall conductors from each other.

17 Claims, 15 Drawing Sheets

(56) References Cited

U.S. PATENT DOCUMENTS

| | | | |
|---|---|---|---|
| 6,822,191 | B2 | 11/2004 | De Steur et al. |
| 6,855,572 | B2 | 2/2005 | Jeung et al. |
| 7,394,152 | B2 | 7/2008 | Yu et al. |
| 7,560,215 | B2 | 7/2009 | Sharma et al. |
| 7,723,159 | B2 | 5/2010 | Do et al. |
| 7,732,907 | B2 | 6/2010 | Han et al. |
| 7,741,156 | B2 | 6/2010 | Pagaila et al. |
| 7,759,800 | B2 | 7/2010 | Rigg et al. |
| 7,829,998 | B2 | 11/2010 | Do et al. |
| 7,838,979 | B2 | 11/2010 | Oh |
| 7,843,046 | B2 | 11/2010 | Andrews et al. |
| 7,951,649 | B2 | 5/2011 | Val |
| 7,972,650 | B1 | 7/2011 | Church et al. |
| 7,994,621 | B2 | 8/2011 | Kim |
| 8,012,802 | B2 | 9/2011 | Sasaki et al. |
| 8,247,268 | B2 | 8/2012 | Do et al. |
| 8,362,621 | B2 | 1/2013 | Lee et al. |
| 2002/0121702 | A1 | 9/2002 | Higgins, III |
| 2003/0138610 | A1 | 7/2003 | Tao |
| 2006/0043569 | A1 | 3/2006 | Benson et al. |
| 2008/0274603 | A1 | 11/2008 | Do et al. |
| 2009/0039528 | A1 | 2/2009 | Haba et al. |
| 2009/0134527 | A1 | 5/2009 | Chang |
| 2009/0160065 | A1 | 6/2009 | Haba et al. |
| 2009/0230533 | A1 | 9/2009 | Hoshino et al. |
| 2010/0001407 | A1 | 1/2010 | Krause et al. |
| 2010/0140811 | A1 | 6/2010 | Leal et al. |
| 2010/0270668 | A1 | 10/2010 | Marcoux |
| 2010/0270688 | A1 | 10/2010 | Su et al. |
| 2010/0320584 | A1 | 12/2010 | Takano |
| 2011/0012246 | A1 | 1/2011 | Andrews, Jr. et al. |
| 2011/0037159 | A1 | 2/2011 | Mcelrea et al. |
| 2012/0119385 | A1 | 5/2012 | Co et al. |
| 2012/0187577 | A1 | 7/2012 | Cordes et al. |
| 2012/0193785 | A1 | 8/2012 | Lin et al. |
| 2013/0010441 | A1 | 1/2013 | Oganesian et al. |
| 2013/0049225 | A1 | 2/2013 | Kang et al. |
| 2014/0054783 | A1* | 2/2014 | Gong et al. ............. 257/773 |
| 2014/0054797 | A1* | 2/2014 | Gong et al. ............. 257/777 |

OTHER PUBLICATIONS

Restriction Requirement mailed Apr. 11, 2014 for U.S. Appl. No. 13/591,924, 9 pages.
Non-Final Office Action mailed Jul. 24, 2014 for U.S. Appl. No. 13/591,924, 16 pages.
Final Office Action mailed Nov. 19, 2014 for U.S. Appl. No. 13/591,924, 21 pages.
Final Office Action mailed Feb. 14, 2014 for U.S. Appl. No. 13/591,969 16 pages.
Final Office Action mailed Sep. 22, 2014 for U.S. Appl. No. 13/591,969 17 Pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Notice of Allowance mailed Jan. 8, 2015 for U.S. Appl. No. 13/591,990, 6 pages.
Non-Final Office Action mailed Nov. 18, 2014 for U.S. Appl. No. 13/906,621, 5 pages.
Final Office Action mailed Dec. 5, 2014 for U.S. Appl. No. 13/829,737, 10 pages.
U.S. Appl. No. 14/573,519, filed Dec. 17, 2014, entitled "Microelectronic Devices with Mutli-Layer Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
U.S. Appl. No. 13/829,737, Office Action—Restriction, mailed May 23, 2014.
U.S. Appl. No. 13/829,737, Office Action—Pre-Interview Communication (Pilot Program), mailed Aug. 14, 2014.
U.S. Appl. No. 13/591,969, Office Action—Rejection, mailed Sep. 13, 2013.
U.S. Appl. No. 13/591,990, Office Action—Rejection, mailed Jul. 5, 2013.
U.S. Appl. No. 13/591,990, Office Action—Rejection, mailed Dec. 19, 2013.
U.S. Appl. No. 13/591,924, Gong, Z., et al., "Stacked MicroElectronic Packages Having Sidewall Conductors and methods for the Fabrication Thereof", filed Aug. 22, 2012.
U.S. Appl. No. 13/591,969, Gong, Z., et al., "Stacked microelectronic Packages Having Patterned Sidewall Conductors and Methods for the Fabrication Thereof", filed Aug. 22, 2012.
U.S. Appl. No. 13/591,990, Vincent, M.B., et al., "Stacked Microelectronic Packages Having Sidewall Conductors and methods for the Fabrication Thereof", filed Aug. 22, 2012.
U.S. Appl. No. 13/906,621, Yap, W.F., et al., "Stacked Microelectronic Packages Having Sidewall Conductors and methods for the Fabrication Thereof", filed May 31, 2013.
U.S. Appl. No. 13/829,737, Yap, W.F., et al., "Stacked Microelectronic Packages Having Sidewall Conductors and Methods for the Fabrication Thereof", filed Mar. 14, 2013.
U.S. Appl. No. 14/042,628, Wright, J.R., et al., "Devices and Stacked Microelectronic Packages with In-Trench Package Surface Conductors and methods of Their Fabrication", filed Sep. 30, 2013.
Notice of Allowance mailed Feb. 3, 2015 for U.S. Appl. No. 14/042,628, 12 pages.
Restriction Requirement mailed Jan. 29, 2015 for U.S. Appl. No. 14/097,424, 8 pgs.
Non-Final Office Action mailed Feb. 12, 2015 for U.S. Appl. No. 14/097,459, 16 pages.
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Non-Final Office Action mailed Mar. 6, 2015 for U.S. Appl. No. 13/829,737, 11 pages.

* cited by examiner

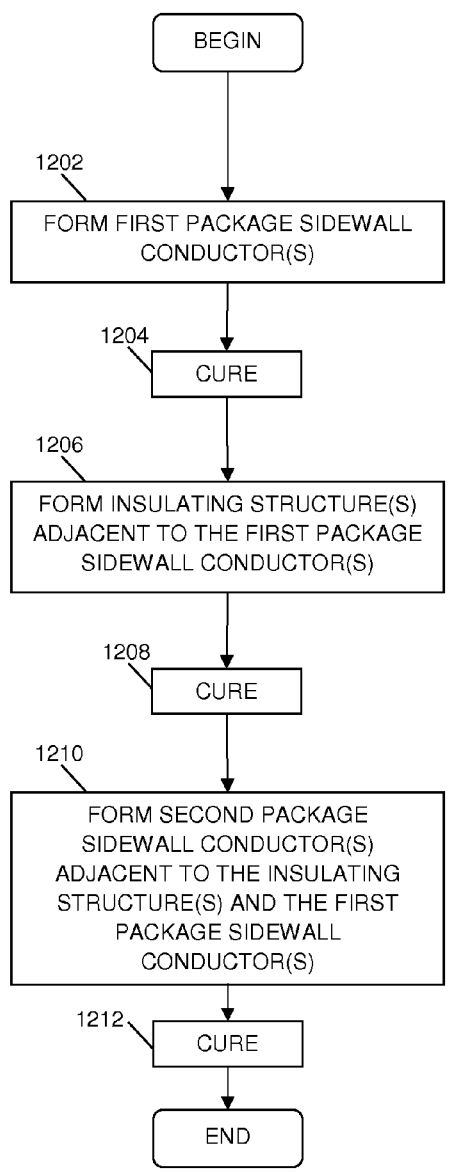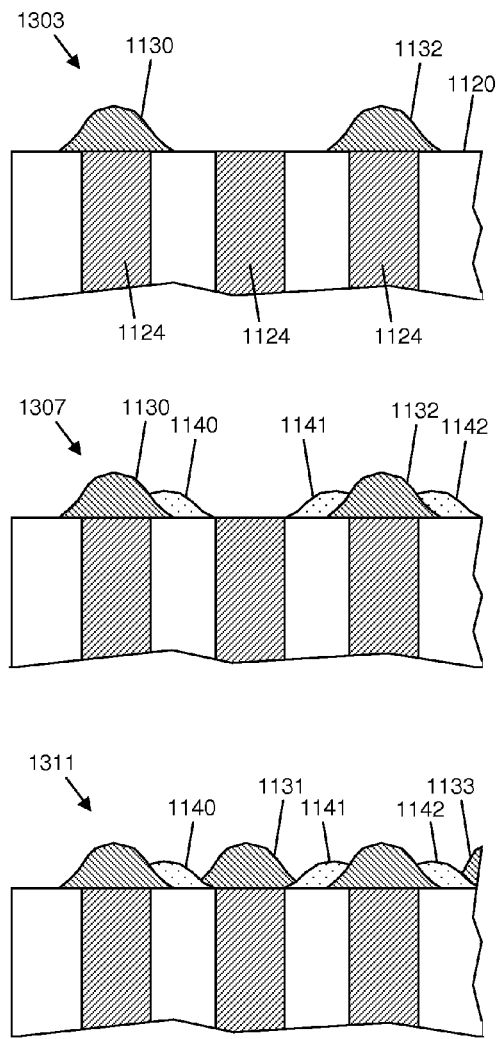
FIG. 12
FIG. 13

DEVICES AND STACKED MICROELECTRONIC PACKAGES WITH PARALLEL CONDUCTORS AND INTRA-CONDUCTOR ISOLATOR STRUCTURES AND METHODS OF THEIR FABRICATION

TECHNICAL FIELD

Embodiments of the present disclosure relate generally to microelectronic packaging and, more particularly, to devices and stacked microelectronic packages having parallel conductors and methods for the fabrication thereof.

BACKGROUND

It is often useful to combine multiple microelectronic devices, such as semiconductor die carrying integrated circuits (ICs), micro-electromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques may enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and:

FIG. 12 is a flowchart of a method for forming adjacent sidewall conductors with an intra-conductor insulating structure, according to an embodiment;

FIG. 13 illustrates cross-sectional side views of a portion of a stacked microelectronic package assembly at various stages of manufacture that correspond with the steps of the flowchart of FIG. 12, according to an embodiment;

Figure 1:
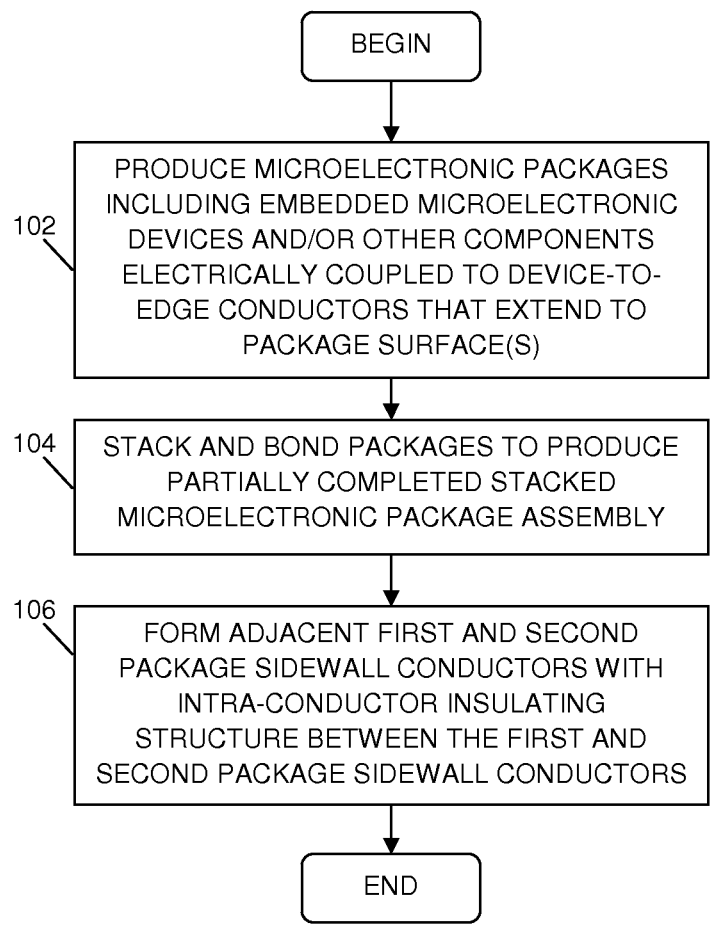
FIG. 1 is a flowchart of a method for fabricating a stacked microelectronic package assembly, according to an embodiment.

For simplicity and clarity of illustration, the drawing figures illustrate the general manner of construction and may omit depiction, descriptions, and details of well-known features and techniques to avoid unnecessarily obscuring the non-limiting embodiments of the disclosure described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following Detailed Description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding Background or the following Detailed Description.

As used herein, the term "microelectronic device" is utilized in a broad sense to refer to an electronic device, element, or component produced on a relatively small scale and amenable to packaging in the below-described manner. Microelectronic devices include, but are not limited to, integrated circuits (ICs) formed on semiconductor die, micro-electromechanical systems (MEMS), passive electronic components, optical devices, and other small scale electronic devices capable of providing processing, memory, sensing, radio frequency communication, radar, optical functionalities, and actuator functionalities, to list but a few examples. The term "microelectronic package" denotes a structure containing at least one and typically two or more microelectronic devices, which may or may not be electrically interconnected. A microelectronic package may include, for example, the one or more microelectronic devices, packaging material (e.g., encapsulant) substantially surrounding the microelectronic devices, one or more patterned conductive layers and other conductive structures (e.g., vias and the like) that provide electrical connectivity with the microelectronic device(s), and one or more contacts for electrically coupling the microelectronic devices of the microelectronic package with external electrical systems. For example, a microelectronic package may be a "fan out wafer level" type of package, also referred to as a "redistributed chip package" (RCP). The term "stacked microelectronic package assembly" refers to an assembly containing at least two microelectronic packages stacked together and physically coupled. According to an embodiment, a bottom package in a stacked microelectronic package may include contact pads on its bottom surface (e.g., ball grid array pads), which enable the stacked microelectronic package to be electrically and physically connected to a printed circuit board (PCB) or other substrate. In addition, in still other embodiments, a top package in a stacked microelectronic package may include contact pads on its top surface, and one or more other devices may be surface mounted to the top surface of the top package.

As will be described in more detail below, an embodiment of a microelectronic package includes at least one "device-to-edge conductor," which is a conductive structure that extends between one or more embedded microelectronic devices or other electrical components and a surface of the microelectronic package (e.g., a sidewall, a top surface, a bottom surface, or a surface that ultimately is embedded within the microelectronic package). In some embodiments, electrical interconnections (referred to herein as "package sidewall conductors" or "package surface conductors") may be formed between exposed ends of device-to-edge conductors of a single microelectronic package. The description, below, refers primarily to "package sidewall conductors." However, it should be understood that the description and the various embodiments may apply equally to package surfaces other than sidewalls. Therefore, each of the below described embodiments extend to embodiments implemented on package sidewalls and other package surfaces. In other embodiments, multiple microelectronic packages with device-to-edge conductors may be stacked together to form a stacked microelectronic package assembly, and package sidewall conductors may be formed between exposed ends of device-to-edge conductors of different microelectronic packages of the stacked microelectronic package assembly. The "exposed end" of a device-to-edge conductor may be referred to herein as a "pad."

A device that includes a single microelectronic package or multiple microelectronic packages in a stacked arrangement may be considered to include a "package body," and one or more device-to-edge conductors may extend to the sidewalls of the package body. As used herein, the term "package body" may mean the structural package components of a single microelectronic package or the structural package components of multiple microelectronic packages in a stacked arrangement, where the "structural package components" are those portions of the device that define the shape of the device and hold the electrical components in a fixed orientation with each other.

In some cases, it may be desirable to form package sidewall conductors that are adjacent to but electrically isolated from each other. Some package sidewall conductor fabrication techniques may produce package sidewall conductors with conductive material that extends beyond the intended design widths of the package sidewall conductors (e.g., due to overspray or bleeding of the conductive material as it is being deposited). Using conventional fabrication techniques, to avoid shorting or high resistance leakage between adjacent package sidewall conductors, the pitch between the adjacent package sidewall conductors should be selected to avoid such potential shorting or leakage. However, this may yield assemblies with a relatively large pitch between adjacent package sidewall conductors. According to various embodiments described herein, the pitch between adjacent package sidewall conductors may be reduced, when compared with conventional structures, while still achieving acceptable electrical isolation between adjacent package sidewall conductors. In other words, the sidewall conductors formed pursuant to embodiments of the below-described fabrication methods may be formed with a relatively fine pitch between conductors.

The following describes embodiments of package sidewall conductors with intra-conductor insulating structures, microelectronic devices, stacked microelectronic package assemblies, and methods of their formation. As will be apparent from the below description, package sidewall conductors with intra-conductor insulating structures can be utilized to provide a convenient manner in which microelectronic devices contained within one or more microelectronic packages can be electrically coupled.

FIG. 1 is a flowchart of an embodiment of a method for fabricating a stacked microelectronic package assembly, according to an embodiment. The completed microelectronic package assembly produced pursuant to the below-described method may also be referred to as a Package-on-Package (PoP) device or a System-in-Package (SiP) device, depending upon the particular manner in which the completed microelectronic package assembly is implemented. Although a result of the performance of the method of FIG. 1 is a microelectronic package assembly that includes multiple, stacked microelectronic packages, it should be understood that embodiments of the inventive subject matter may be utilized with a single microelectronic package, as well.

As shown in FIG. 1 and described in detail below, the method is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of a stacked microelectronic package assembly or certain components included within a stacked microelectronic package assembly are well-known and, in the interests of brevity, will only be mentioned briefly herein or will be omitted entirely without providing the well-known process details. It will be appreciated that method can be utilized to produce various other types of stacked microelectronic package assemblies having configurations that are different from those included in the Figures.

Referring to FIG. 1, the method begins with the production of a number of microelectronic packages in process 102. More particularly, as will be described in detail below, process 102 results in the production of a number of microelectronic packages that include embedded microelectronic devices and/or other components that are electrically coupled to device-to-edge conductors that extend to one or more package surfaces. Any method suitable for fabricating a stackable package or microelectronic package having at least one electrically-conductive element exposed through a package sidewall and electrically coupled to microelectronic device contained within the microelectronic package can be carried-out during process 102. Embodiments of the inventive subject matter may be implemented in various types of microelectronic packages that can be fabricated to include device-to-edge conductors that extend to one or more surfaces of the package, including but not limited to substrate based wirebond packages, flip chip packages, and redistributed chip packages (RCP), for example. Although embodiments illustrated in the figures and discussed below pertain to RCP types of packages, it is to be understood that the inventive subject matter is not limited to application only in RCP types of packages.

Figure 2:
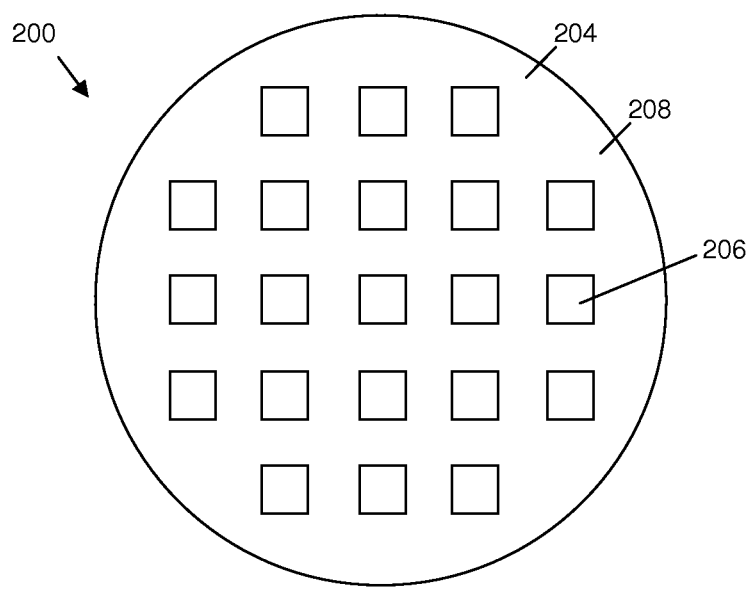
FIG. 2 is a top-down view illustrating a partially-completed microelectronic device panel, according to an embodiment.

FIGS. 2-5 illustrate various stages in the production of an embodiment of a microelectronic package. More specifically, FIG. 2 is a top-down view illustrating a partially-completed microelectronic device panel 200, which corresponds to a first stage of production of an embodiment of a microelectronic package (e.g., a first stage of production carried out in conjunction with process 102, FIG. 1). According to an embodiment, microelectronic device panel 200 may be produced utilizing an RCP process. More specifically, microelectronic device panel 200 includes a panel body 208 in which a plurality of microelectronic devices 206 are embedded. Microelectronic devices 206 may be substantially identical or may instead vary in type, function, size, and so on. For example, certain ones of devices 206 may be a first type of device (e.g., an application specific integrated circuit (ASIC) die, a microprocessor, or another type of device), while others of devices 206 may be a second type of device (e.g., a MEMS device or another type of device). According to an embodiment, devices 206 have contact bearing surfaces that are exposed through major surface 204 of panel body 208 (referred to herein as "panel surface 204"). In the illustrated example, device panel 200 includes twenty one square-shaped devices 206 arranged in a grid pattern or array. However, the number of microelectronic devices, the planform dimensions of the microelectronic devices (e.g., the die shape and size), and the manner in which the devices are spatially distributed within panel body 208 may vary amongst embodiments. Panel body 208 is typically produced as a relatively thin, disc-shaped body or mass having a generally circular planform geometry. However, panel body 208 can be fabricated to have any desired shape and dimensions. In various embodiments, panel body 208 can have a thickness that is less than, equivalent to, or slightly exceeding the original height of microelectronic devices 206 to minimize the overall vertical profile of the completed stacked microelectronic package assembly.

According to an embodiment, microelectronic device panel 200 may be produced as follows. First, microelectronic devices 206 are positioned in a desired spatial arrangement over the surface of a support substrate or carrier (not shown), with their contact bearing surfaces in contact with the carrier. For example, devices 206 may be arranged over the carrier in a grid array of the type shown in FIG. 2. If desired, one or more release layers may also be applied or formed over the carrier's upper surface prior to positioning of microelectronic devices 206. A mold frame with a central cavity or opening therethrough may be positioned over the carrier and around the array of microelectronic devices 206. An encapsulant, such as a silica-filled epoxy, may then be dispensed into the cavity of the mold frame and allowed to flow over microelectronic devices 206. Sufficient volume of the encapsulant may be dispensed over microelectronic devices 206 to enable the encapsulant to flow over the uppermost or non-contact-bearing surfaces of the microelectronic devices 206. The encapsulant may then be solidified by, for example, an oven cure to yield a solid panel body 208 in which microelectronic devices 206 are embedded. Panel body 208 may be rigid or flexible, depending upon the chosen encapsulant. Panel body 208 may then be released from the carrier to reveal the backside of body 208 through which the contact-bearing surfaces of microelectronic devices 206 are exposed (e.g., panel surface 204 in the embodiment shown in FIG. 2). If desired, the front side of panel body 208 may be ground or polished to bring device panel 200 to a desired thickness prior to release of the panel body from the carrier. The foregoing example notwithstanding, panel body 208 can be produced utilizing various other known fabrication techniques including, for example, compression molding and lamination processes.

After encapsulation of microelectronic devices 206 within panel body 208, a plurality of device-to-edge conductors may be fabricated over panel surface 204 of microelectronic device panel 200. In other embodiments, device-to-edge conductors may be formed entirely or partially at or below the panel surface (e.g., portions of the device-to-edge conductors may be embedded within or at the surface of the encapsulant or package). The term "device-to-edge conductor," as used herein, refers to an electrically-conductive structure or element, such as a metal trace, a wire, an interconnect line, a metal-filled trench, a bond pad, a combination thereof, or the like. Each device-to-edge conductor is electrically coupled to an electrical component that is embedded in a microelectronic package and/or that has at a connection point (to the device-to-edge conductor) that is not co-located with the package surface on which surface conductors are to be formed (e.g., a microelectronic device or other electrical component embedded within a microelectronic package, a bond pad on a bottom surface of the device, and so on). In addition, each device-to-edge conductor extends to a sidewall or other surface of the package to contact a package surface conductor, such as the sidewall conductors described below in conjunction with FIGS. 8-22. The device-to-edge conductors can assume a wide variety of different forms. In some embodiments, a device-to-edge conductor may consist of or include a combination of one or more electrically-conductive lines (e.g., metal traces), vias, metal plugs, and/or other conductive features, which are formed on, between, and/or through one or more dielectric layers. The conductive lines may be included within one or more layers that may be referred to as "build-up layers," "metal layers," or "redistribution layers" (RDLs). Collectively, the conductive features provide an electrically conductive path between an encapsulated microelectronic device 206 and a package sidewall conductor to be formed later on the package sidewall, as described below in conjunction with FIGS. 8-22.

Figure 3:
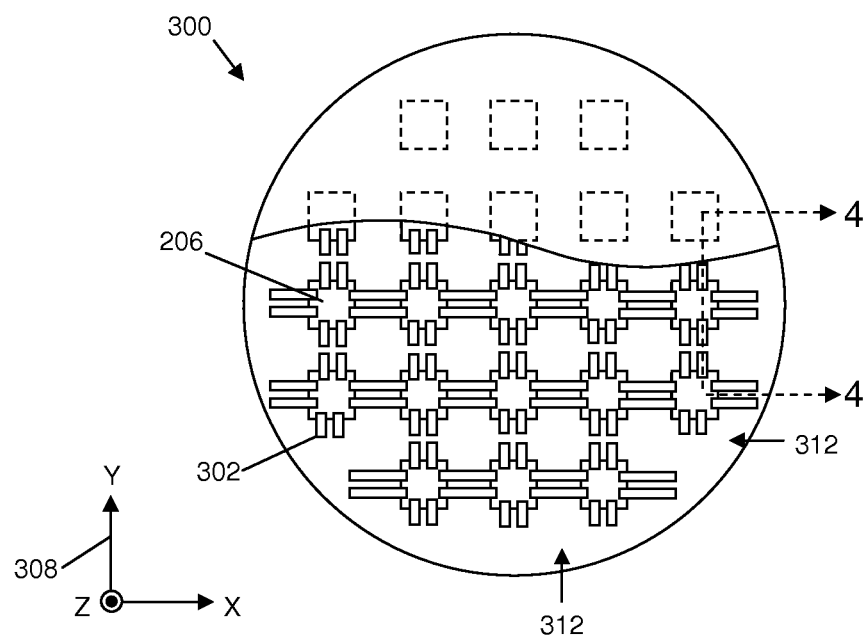
FIG. 3 illustrates a top-down view illustrating the partially-completed microelectronic device panel of FIG. 2 at a later stage of production, according to an embodiment.
Figure 4:
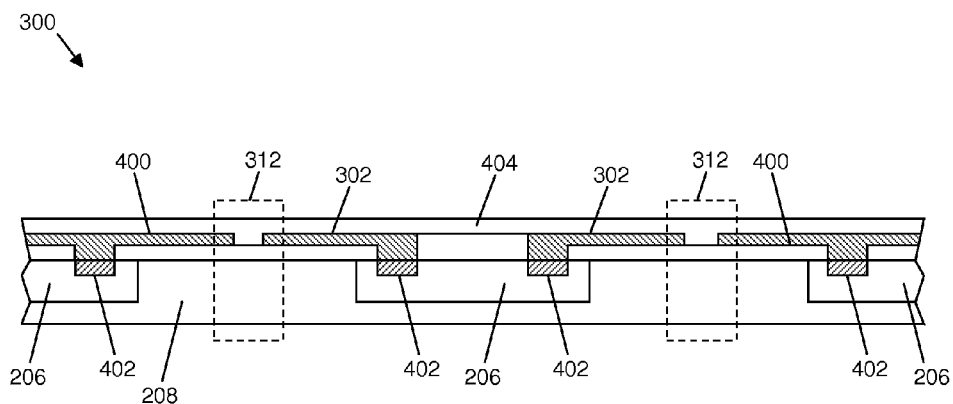
FIG. 4 is a cross-sectional view of a portion of the microelectronic device panel of FIG. 3, according to an embodiment.

FIG. 3 illustrates a top-down view of a partially-completed microelectronic device panel 300 at a later stage of production of an embodiment of a microelectronic package (e.g., a next stage of production carried out in conjunction with process 102, FIG. 1), and FIG. 4 is a cross-sectional view of a portion of the microelectronic device panel 300 of FIG. 3, according to an embodiment. In FIG. 3, microelectronic device panel 300 represents a partially cut-away version of device panel 200 after one or more build-up layers (including device-to-edge conductors 302) have been formed over device surface 204 (FIG. 2). The cut-away portion of FIG. 3 shows a number of device-to-edge conductors 302 that can be included in one or more build-up layers over device surface 204 during production of microelectronic device panel 300. As shown in FIGS. 3 and 4, device-to-edge conductors 302 may include a number of interconnect lines or metal (e.g., copper) traces. The trace portions of the device-to-edge conductors 302 may extend along a plane parallel with device surface 204 or, stated differently, along the x-y plane identified in FIG. 3 by coordinate legend 308. Device-to-edge conductors 302 can be produced using bumping or wafer level packaging fabrication techniques such as sputtering, plating, jetting, photolithography, and/or stencil printing (e.g., of an electrically-conductive ink), to list but a few examples. Device-to-edge conductors 302 may be formed on or between one or more layers of dielectric material 400, for example.

As may be appreciated most readily with reference to FIG. 4, device-to-edge conductors 302 are electrically coupled to a number of landing pads or other electrical contact points 402 provided on each microelectronic device 206. Device-to-edge conductors 302 may be electrically connected to device contact points 402 by filled vias, plated vias, metal plugs, or the like formed through the dielectric layer 400 or layers underlying the trace portions of device-to-edge conductors 302. After formation of device-to-edge conductors 302, one or more overlying dielectric, capping, or passivation layers 404 may be formed over device-to-edge conductors 302 utilizing a spin-on coating process, printing, lamination, or another deposition technique.

According to an embodiment, device-to-edge conductors 302 extend from their respective microelectronic devices 206 to neighboring dicing streets 312, which surround or border each device 206. Dicing streets 312 represent portions of device panel 300 located between and around devices 206. According to an embodiment, dicing streets 312 do not include electrically-active elements and the material within the dicing streets 312 is removed during singulation to yield individual microelectronic packages. Dicing streets 312 are also commonly referred to as "saw streets". However, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring device-to-edge conductors 302, which extend along aligning axes (e.g., x- and/or y-axes of coordinate system 308), can be formed to connect or meet within dicing streets 312 and thereby form a continuous conductive line extending between neighboring microelectronic devices 206, as is the case for device-to-edge conductors 302 that are aligned in parallel with the x-axis in FIG. 3. However, the portions of device-to-edge conductors 302 extending into dicing streets 312 alternatively may not be continuous between neighboring microelectronic devices 206, as is the case for device-to-edge conductors 302 that are aligned in parallel with the y-axis in FIG. 3.

While a single layer or level of device-to-edge conductors 302 are shown to be included in microelectronic panel 300 in the example embodiment shown in FIGS. 3 and 4, multiple layers or levels of device-to-edge conductors 302 can be included within a microelectronic panel, in other embodiments. Furthermore, in embodiments in which one or more of the individual microelectronic packages include multiple embedded microelectronic devices, additional conductors may also be formed at this juncture in the fabrication process in conjunction with the formation of device-to-edge conductors 302, where those additional conductors may serve to interconnect the multiple devices included within each microelectronic package.

Figure 5:
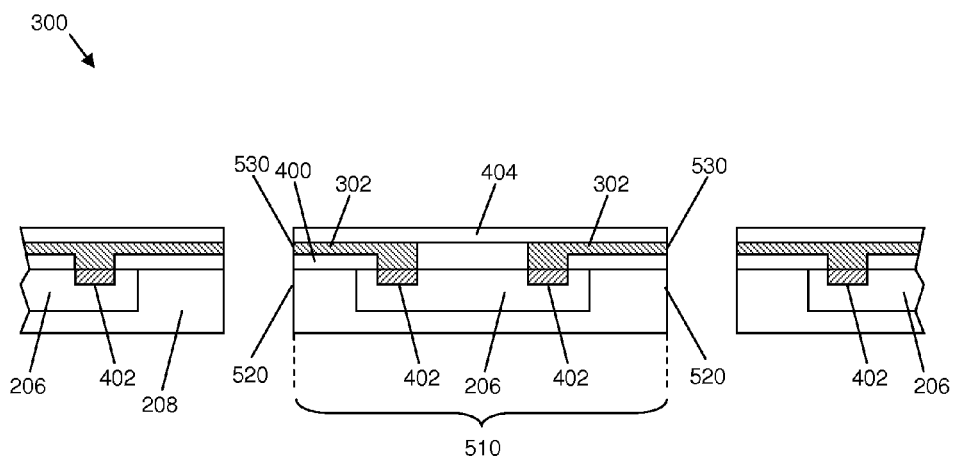
FIG. 5 illustrates a cross-sectional view of the portion of the microelectronic device panel of FIG. 4 after singulation, according to an embodiment.
Figure 9:
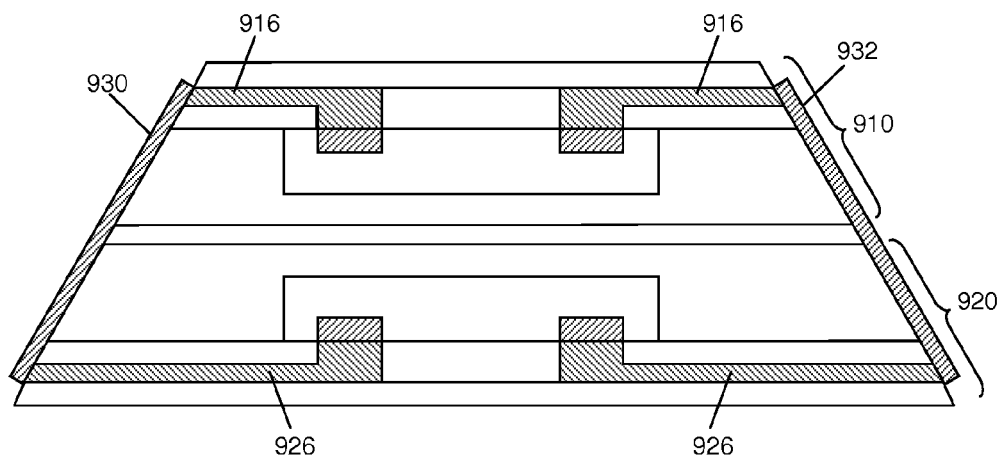
FIG. 9 illustrates the partially-completed, stacked microelectronic package assembly with package sidewall conductors, according to another embodiment.

Referring now to FIG. 5, microelectronic device panel 300 is singulated to complete production of the microelectronic packages during process 102 of method 100 (FIG. 1). As previously indicated, panel singulation can be carried-out by mechanical sawing. However, any suitable separation process can be utilized, including laser cutting and scribing with punching. In one embodiment, singulation is performed utilizing a conventional dicing saw, such as a water-cooled diamond saw. FIG. 5 illustrates, in cross-sectional view, a portion of microelectronic device panel 300 after singulation to yield a plurality of microelectronic packages 510 (only one of which is fully shown and identified in FIG. 5). According to an embodiment, each microelectronic package 510 is cut to have a substantially rectangular shape and to include four package edges or sidewalls 520 that are substantially orthogonal with respect to the package top and bottom surfaces. In another embodiment, singulated microelectronic packages may have package sidewalls that are not orthogonal to the top and bottom surfaces of the package (e.g., as depicted in the embodiment of FIG. 9, described later).

Either way, as device-to-edge conductors 302 were previously formed to extend into dicing streets 312 (now removed), distal ends 530 of the device-to-edge conductors 302 extend to and are exposed at the sidewalls 520 of the singulated microelectronic packages 510. The ends of the device-to-edge conductors 302 also are referred to herein as "sidewall pads" or "package surface pads" herein. In various embodiments, a microelectronic package 510 may be configured so that device-to-edge conductors 302 extend to each of the four package sidewalls 520. However, in other embodiments, a microelectronic package may be configured so that device-to-edge conductors 302 extend to fewer than all of the package sidewalls (e.g., to one, two, or three sidewalls) and/or to other package surfaces.

Referring again to FIG. 1, in process 104, a singulated microelectronic package (e.g., microelectronic package 510 produced during process 102) may be combined with (e.g., stacked and bonded with) one or more additional microelectronic packages to produce a partially-completed stacked microelectronic package assembly. For example, FIGS. 6-7 include an exploded cross-sectional view and a cross-sectional view, respectively, depicting a manner which a first microelectronic package 510 may be positioned in stacked relationship with a second microelectronic package 610 to produce a partially-completed stacked microelectronic package assembly, according to an embodiment. Any suitable number of additional device layers may also be included within a partially-completed stacked microelectronic package assembly. For convenience of explanation and illustration, microelectronic package 610 is illustrated and described as being substantially identical to microelectronic package 510. However, it is to be understood that microelectronic packages 510, 610 may be differently configured. According to an embodiment, however, microelectronic package 610 also includes one or more microelectronic devices 606 embedded in a microelectronic package body 608, and a plurality of device-to-edge conductors 602 (e.g., including metal traces) extending from electrical contact points 604 of devices 606 to the package sidewalls. In view of the illustrated orientation of the stacked microelectronic package assembly of FIGS. 6 and 7, microelectronic package 510 will be referred to as "upper microelectronic package 510" below, while microelectronic package 610 will be referred to as "lower microelectronic package 610." It should be understood, however, that this terminology is used for convenience of reference only, that the orientation of the completed stacked microelectronic package assembly is arbitrary, and that the microelectronic package assembly may be inverted during later processing steps and/or when incorporated into a larger electronic system or device.

Figure 6:
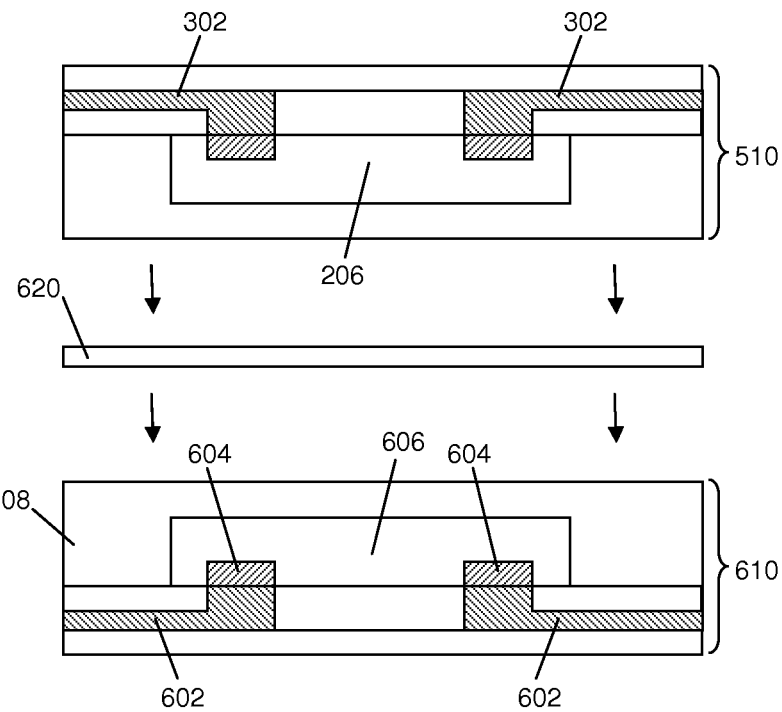
FIGS. 6-7 are exploded cross-sectional and cross-sectional views, respectively, depicting a manner which a first microelectronic package may be positioned in stacked relationship with a second microelectronic package to produce a partially-completed stacked microelectronic package assembly, according to an embodiment.
Figure 7:
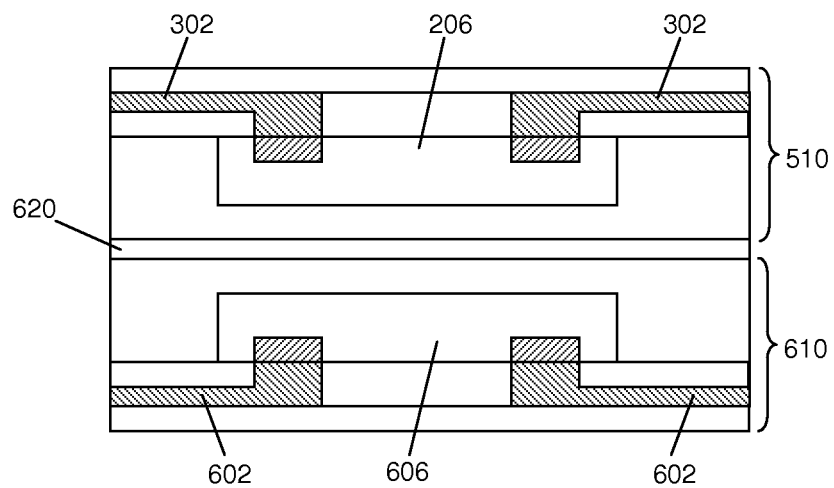

Microelectronic packages 510, 610 (and any additional microelectronic device panels included within the partially-completed stacked microelectronic package assembly) may be laminated or otherwise coupled together during process 104 of method 100. As indicated in FIGS. 6 and 7, this may be accomplished by applying or otherwise positioning an intervening bonding layer 620 between microelectronic packages 510, 610 prior to package stacking. Bonding layer 620 can be an epoxy or other adhesive, which may be applied over the upper surface of lower microelectronic package 610 and thermally cured after positioning of upper microelectronic package 510, for example. This example notwithstanding, any suitable bonding material or means can be utilized to bond microelectronic packages 510, 610 together including, for example, double-sided adhesive tape, soldering, gluing, brazing, and so on. By coupling microelectronic packages 510, 610 together in this manner, the relative positioning of microelectronic packages 510, 610 and, therefore, the relative positioning of the microelectronic devices 206 and 606 embedded within microelectronic packages 510, 610 can be maintained during further processing. Microelectronic packages 510, 610, and any other microelectronic packages to be included within the stacked microelectronic package assembly can be tested prior to stacking to ensure that only known-good microelectronic packages are consolidated during process 104.

In the embodiment illustrated in FIGS. 6 and 7, microelectronic package 510 is positioned in a stacked relationship with one additional microelectronic package 610 after both packages 510, 610 have been singulated from a device panel (e.g., panel 300, FIG. 3). However, in other embodiments, microelectronic package 510 may be positioned in a stacked relationship with microelectronic package 610 prior to singulation of microelectronic package 610 from its corresponding device panel. In other words, multiple instances of singulated microelectronic package 510 may be stacked on and bonded to non-singulated instances of microelectronic packages 610. After bonding the singulated packages 510 to the non-singulated packages 610 of the device panel (e.g., in the above-described manner), the individual stacked microelectronic package assemblies may then be separated by singulation of the panel that includes microelectronic device packages 610. This alternative fabrication technique likewise yields a plurality of partially-completed stacked microelectronic package assemblies, such as the stacked microelectronic package assembly shown in FIG. 7. In still further embodiments, two or more device panels may be stacked, bonded, and then singulated to produce a plurality of partially-completed stacked microelectronic package assemblies during process 104.

Although the example shown in FIG. 7 depicts a first surface of microelectronic package 510 bonded to a second surface of microelectronic package 610 (e.g., in a "face-to-face" arrangement), a second surface of microelectronic package 510 may be bonded to the second surface of microelectronic package 610 (e.g., in a "back-to-back" arrangement), the first surface of microelectronic package 510 may be bonded to the first surface of microelectronic package 610 (e.g., in a "face-to-back" arrangement), or the second surface of microelectronic package 510 may be bonded to the first surface of microelectronic package 610 (e.g., in another "face-to-back arrangement). The foregoing processes are all considered to constitute the stacking of microelectronic device packages, whether stacking is performed utilizing multiple singulated packages, multiple non-singulated packages in the form of multiple device panels, or a combination of singulated packages and one or more device panels. Manufacturing techniques in which package stacking is performed on a partial or full panel level can facilitate the positioning and bonding of the stacked microelectronic package assemblies, thereby potentially improving throughput while reducing manufacturing time and cost.

Figure 8:
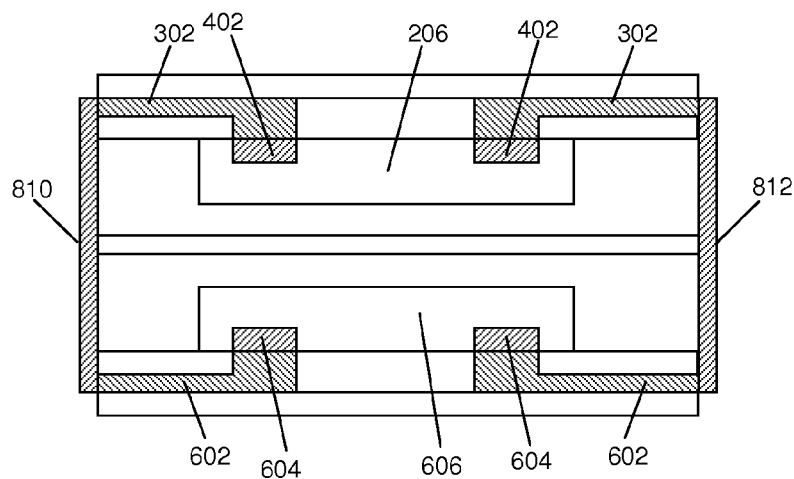
FIG. 8 illustrates the partially-completed, stacked microelectronic package assembly of FIG. 7 with package sidewall conductors, according to an embodiment.

Referring again to FIG. 1 and also to FIG. 8, in process 106, package sidewall conductors 810, 812 are then formed with an intra-conductor insulating structure (e.g., insulating structure 1040, FIG. 10) between adjacent package sidewall conductors 810, 812. Although embodiments of intra-conductor insulating structures will be better illustrated and described in conjunction with FIGS. 10-22, below, an embodiment of a package sidewall conductor 810, 812 will first be described in conjunction with FIG. 8. More specifically, FIG. 8 illustrates a cross-sectional, side view of the partially-completed stacked microelectronic package assembly of FIG. 7 with package sidewall conductors 810, 812 formed on the sidewalls of microelectronic packages 510, 610, according to an embodiment. Each package sidewall conductor 810, 812 electrically couples distal ends of at least two device-to-edge conductors (or two distinct sidewall pads). For example, as shown in FIG. 8, a first package sidewall conductor 810 electrically couples a first pair of device-to-edge conductors 302, 602 that are exposed on first sidewalls of devices 510, 610, and a second package sidewall conductor 812 electrically couples a second pair of device-to-edge conductors 302, 602 that are exposed on second sidewalls of devices 510, 610.

Although the embodiments discussed herein include package sidewall conductors that extend between device-to-edge conductors of different microelectronic packages within a stack, in other embodiments, package sidewall conductors may extend between multiple device-to-edge conductors of a same microelectronic package. In addition, although the Figures depict package sidewall conductors that extend in a vertical direction with respect to the package top and bottom surfaces (which are considered to be in horizontal planes), package sidewall conductors may extend in horizontal, diagonal, or other directions, as well, in other embodiments. Further, embodiments of the inventive subject matter may include devices in which adjacent conductors with parallel portions and intra-conductor insulating structures are formed on package surfaces other than sidewalls. For example, adjacent conductors with parallel portions and intra-conductor insulating structures may be formed on a top surface, a bottom surface, and/or on embedded surfaces (e.g., between package layers) of a microelectronic package. Accordingly, a "package surface," as used herein, may mean a sidewall, a top surface, a bottom surface, or an embedded surface. Further, a "surface conductor," as used herein, may mean a conductor formed on a sidewall (e.g., a sidewall conductor), a top surface, a bottom surface, or an embedded surface of a microelectronic package. For ease of illustration and explanation, however, the Figures and description depict and describe vertically-oriented package sidewall conductors that extend between device-to-edge conductors of stacked microelectronic packages (e.g., packages 510, 610). According to an embodiment, microelectronic packages 510, 610 are fabricated so that, once they are assembled together to form a microelectronic package assembly, pairs of sidewall pads (i.e., the exposed distal ends of a pair of the device-to-edge conductors) generally align with each other in a vertical direction. However, as package sidewall conductors may have non-linear shapes and/or non-vertical orientations, the sidewall pads within a pair may not be aligned with each other in a vertical direction, in other embodiments.

According to an embodiment, package sidewall conductors 810, 812 may be formed by depositing electrically conductive material on the sidewalls of microelectronic packages 510, 610. More particularly, each package sidewall conductor 810, 812 may have a first portion in electrical contact with a first sidewall pad (i.e., the exposed end of a first device-to-edge conductor 302), and a second portion in electrical contact with a second sidewall pad (i.e., the exposed end of a second device-to-edge conductor 602). Each package sidewall conductor 810, 812 electrically couples different ones (typically pairs) of device-to-edge conductors 302, 602, and thereby electrically interconnects the microelectronic packages 510, 610 and, specifically, the microelectronic devices 206, 606 contained therein. Additionally or alternatively, a package sidewall conductor may electrically couple device-to-edge conductors of a same microelectronic package, as mentioned above.

According to an embodiment, sidewall conductors 810, 812 may be formed from a material that includes electrically-conductive adhesive (ECA). In other embodiments, other suitable conductive materials may be used, including but not limited to conductive polymers and conducting polymers (e.g., polymers filled with conductive particles and/or nanoparticles such as metals (e.g., silver, nickel, copper, gold, and so on), alloys of metals, metal coated organic particles, metal coated ceramic particles), solder pastes, solder-filled adhesives, particle- and nanoparticle-filled inks, liquid metals (e.g., GaIn and other liquid metals), and metal-containing adhesives or epoxies, such as silver-, nickel-, and copper-filled epoxies (collectively referred to herein as "electrically-conductive pastes"). Suitable conductive materials also include low melting point metals and alloys lacking resins or fluxes (e.g., metals and alloys having melting points below 300° C.). Such materials include, but are not limited to, indium and bismuth. In any event, the conductive material of package sidewall conductors 810, 812 may be applied on the package sidewall surfaces by spraying, inkjet and/or aerosol jet printing, stencil printing, needle dispense, or another dispensing method. For some types of dispensing methods, the material for each package sidewall conductor 810, 812 may be deposited using multiple deposition passes, where each pass may successively increase the height of the sidewall conductors 810, 812.

Although the various figures depict package sidewalls that are substantially orthogonal to the top and bottom surfaces of a package, the package sidewalls may be non-orthogonal to the top and bottom surfaces of a package, in other embodiments. For example, FIG. 9 illustrates a cross-sectional, side view of a partially-completed stacked microelectronic package assembly with package sidewall conductors 930, 932 formed on non-orthogonal sidewalls of microelectronic packages 910, 920, according to another embodiment. As with the previously-described embodiments, each package sidewall conductor 930, 932 electrically couples distal ends of at least two device-to-edge conductors (or two distinct sidewall pads). For example, as shown in FIG. 9, a first package sidewall conductor 930 electrically couples a first pair of device-to-edge conductors 916, 926 that are exposed on first sidewalls of devices 910, 920, and a second package sidewall conductor 932 electrically couples a second pair of device-to-edge conductors 916, 926 that are exposed on second sidewalls of devices 910, 920. Implementation of the various embodiments using devices (e.g., devices 910, 920) with non-orthogonal sidewalls may have some manufacturing advantages. For example, in an embodiment in which the sidewall conductors 930, 932 are printed onto the device sidewalls using a print head, the print head may be positioned vertically during the dispensing process (e.g., pointed straight down toward the sidewalls), rather than at a non-vertical angle, as would likely be implemented for dispensing sidewall conductors on sidewalls that are orthogonal to the top and bottom package surfaces.

Figure 10:
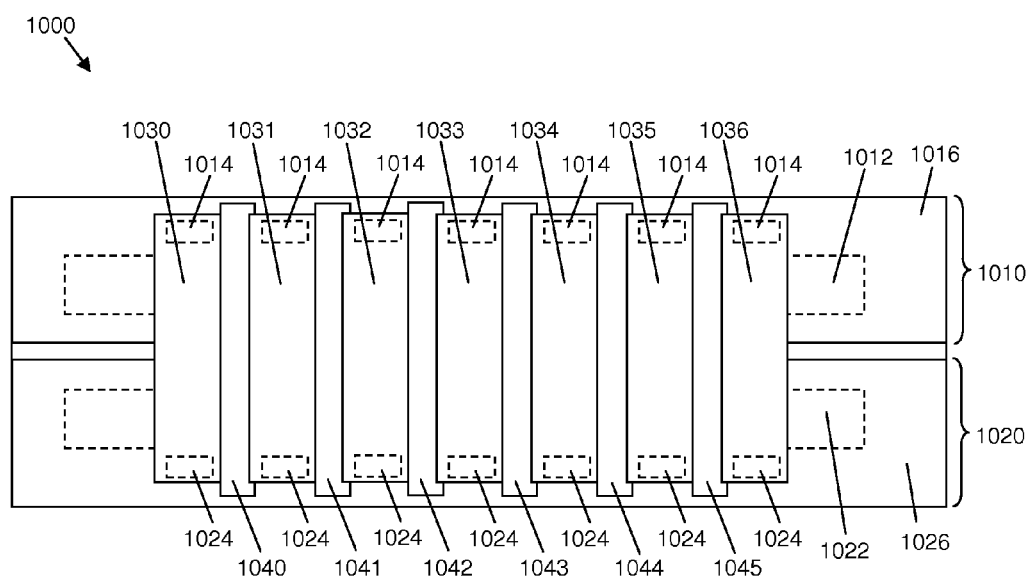
FIG. 10 illustrates a side view of a stacked microelectronic package assembly with a plurality of sidewall conductors, according to an embodiment.

FIG. 10 illustrates a side view of a stacked microelectronic package assembly 1000 with a plurality of sidewall conductors 1030, 1031, 1032, 1033, 1034, 1035, 1036 and intra-conductor insulating structures 1040, 1041, 1042, 1043, 1044, 1045, according to an embodiment. More specifically, FIG. 10 illustrates a stacked microelectronic package assembly 1000 that includes first and second microelectronic packages 1010, 1020, which are bonded together in a stacked orientation. The first microelectronic package 1010 includes a first microelectronic device 1012 electrically coupled with a first plurality of device-to-edge conductors 1014 with ends or sidewall pads that coincide with package sidewall 1016. Similarly, the second microelectronic package 1020 includes a second microelectronic device 1022 electrically coupled with a second plurality of device-to-edge conductors 1024 with ends or sidewall pads that coincide with package sidewall 1026. Both the microelectronic devices 1012, 1022 and the sidewall pads of the device-to-edge conductors 1014, 1024 are illustrated using dashed lines in FIG. 10 to indicate that they would not actually be visible in an exterior view (e.g., the side view of FIG. 10).

In FIG. 10, vertically aligned pairs of device-to-edge conductors 1014, 1024 each are electrically coupled together through a package sidewall conductor 1030-1036. The package sidewall conductors 1030-1036 are deposited on or above the package sidewall surfaces, and each has a particular line width, line height, and pitch between adjacent package sidewall conductors 1030-1036. The line width and line height may be affected by any of a number of factors that relate to the materials and deposition technique used, including viscosity of the material, drying rate of solvents in the material, sidewall surface energy, material surface tension, sidewall roughness, spray focus, stencil width, and so on. In various embodiments, the line width and line height depend on the materials and deposition techniques that are used. For example, the line widths may be in a range of about 10 microns to about 200 microns, and the line heights may be in a range of about 1 micron to about 20 microns, although the line widths and/or line heights may be larger or smaller, as well. In general, the line width affects the minimum pitch between adjacent sidewall conductors 1030-1036 while still achieving adequate reliability (e.g., minimal shorting between adjacent sidewall conductors 1030-1036). According to various embodiments, however, the minimum pitch may be reduced and/or the line width and/or line height may be increased (e.g., to achieve higher current density), when compared with conventional techniques, by providing electrical insulation between the adjacent sidewall conductors 1030-1036.

More particularly, according to an embodiment, each pair of adjacent sidewall conductors 1030-1036 is electrically insulated from each other with an intra-conductor insulating structure 1040-1045. For example, the sidewall conductors in adjacent pair of sidewall conductors 1030, 1031 are electrically insulated from each other by intra-conductor insulation structure 1040, sidewall conductors 1031, 1032 are electrically insulated from each other by intra-conductor insulation structure 1041, and so on. According to various embodiments, the intra-conductor insulating structures 1040-1045 are deposited on or above the package sidewall surfaces, and are formed from one or more materials that are electrically non-conductive and that have good adhesion with the materials of microelectronic packages 1010, 1020 and the package sidewall conductors 1030-1036. For example, the intra-conductor insulating structures 1040-1045 may be formed from one or more materials selected from an epoxy, silicone, cyanide esters, acrylic, a polymer adhesive, or other suitable materials. According to an embodiment, the intra-conductor insulating structures 1040-1045 have thicknesses in a range of about 0.5 micron to about 10 microns, although the intra-conductor insulating structures 1040-1045 may be thicker or thinner, as well.

Each intra-conductor insulation structure 1040-1045 directly contacts package sidewalls 1016, 1026 along substantially an entire length of the intra-conductor insulation structure 1040-1045 between adjacent sidewall conductors 1030-1036. Further, each intra-conductor insulation structure 1040-1045 is configured so that it overlaps and/or underlaps portions of the sidewall conductors 1031-1036 in an adjacent pair in a manner that it provides electrical insulation between the sidewall conductors 1031-1036. As will be explained and illustrated in more detail below, the overlapping and underlapping relationships between adjacent package sidewall conductors 1030-1036 and intra-conductor insulating structures 1040-1045 enables the pitch between the adjacent package sidewall conductors 1030-1036 to be relatively small while still ensuring adequate electrical insulation between the adjacent package sidewall conductors 1030-1036. For example, according to various embodiments, the pitch between adjacent sidewall conductors 1030-1036 may be as small as 100 microns or less, although the pitch may be greater, as well.

In the embodiment illustrated in FIG. 10, a first portion (e.g., the left edge) of each intra-conductor insulation structure 1040-1045 is disposed over (or overlaps) a portion (e.g., the right edge) of one sidewall conductor 1030-1036 in each adjacent pair, and another portion (e.g., the right edge) of the intra-conductor insulation structure 1040-1045 is disposed under (or underlaps) a portion (e.g., the left edge) of a second sidewall conductor 1030-1036 of the adjacent pair. As will be explained in more detail below, such a configuration may be achieved by first depositing a first sidewall conductor in an adjacent pair (e.g., sidewall conductor 1030), then depositing an intra-conductor insulation structure (e.g., intra-conductor insulation structure 1040) so that the intra-conductor insulation structure partially overlaps the first sidewall conductor, and thereafter depositing a second sidewall conductor in the adjacent pair (e.g., sidewall conductor 1031) so that the second sidewall conductor partially overlaps the intra-conductor insulation structure. Using such a technique, the intra-conductor insulation structure may be configured to provide effective electrical insulation between the pair of adjacent sidewall conductors.

In the various illustrated embodiments, package sidewall conductors are shown to have a generally elongated linear shapes and vertical orientations, and adjacent sidewall conductors are shown to run in parallel with each other along substantially an entire length of the sidewall conductors. However, in other embodiments, package sidewall conductors may have non-linear shapes (e.g., curved shapes, shapes that include adjoining linear segments at different orientations (e.g., zig-zag, stair step), and so on), and/or package sidewall conductors may have horizontal and/or diagonal orientations. In addition, in some embodiments, "adjacent" package sidewall conductors may not run in parallel with each other across their entire lengths. However, in order to be considered "adjacent," as that term is used herein, a set of package sidewall conductors at least will have elongated portions that are parallel with each other, where an intra-conductor insulation structure is used to provide electrical insulation between the adjacent and parallel elongated portions of the set of package sidewall conductors. According to an embodiment, and as used herein, the term "elongated portion" means a portion of a package sidewall conductor having a length that is at least 5 times greater than a line width of the package sidewall conductor. According to another embodiment, the term "elongated portion" means a portion of a package sidewall conductor having a length that is at least 20 times greater than a line width of the package sidewall conductor.

Figure 11:
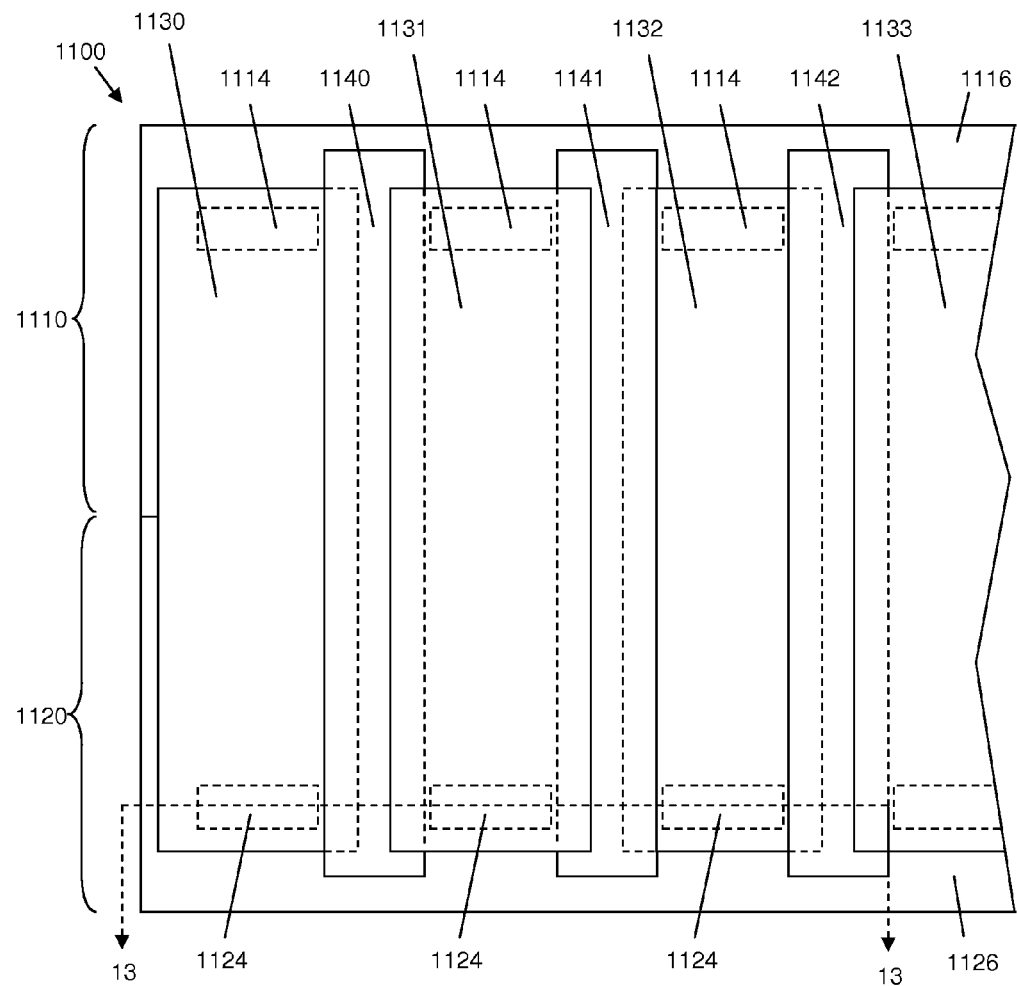
FIG. 11 illustrates an enlarged, side view of a portion of a stacked microelectronic package assembly, according to an embodiment.

FIG. 11 illustrates an enlarged, side view of a portion of a stacked microelectronic package assembly 1100, according to another embodiment. The embodiment of FIG. 11 is similar to the embodiment of FIG. 10, in that stacked microelectronic package assembly 1100 includes a plurality of sidewall conductors 1130, 1131, 1132, 1133 and intra-conductor insulating structures 1140, 1141, 1142, according to an embodiment. More specifically, FIG. 11 illustrates a stacked microelectronic package assembly 1100 that includes first and second microelectronic packages 1110, 1120, which are bonded together in a stacked orientation. The first microelectronic package 1110 includes a first microelectronic device (not illustrated) electrically coupled with a first plurality of device-to-edge conductors 1114 with ends or sidewall pads that coincide with package sidewall 1116. Similarly, the second microelectronic package 1120 includes a second microelectronic device (not illustrated) electrically coupled with a second plurality of device-to-edge conductors 1124 with ends or sidewall pads that coincide with package sidewall 1126. The sidewall pads of the device-to-edge conductors 1114, 1124 and overlapped portions of the sidewall conductors 1130, 1132 and intra-conductor insulating structures 1140-1142 are illustrated using dashed lines in FIG. 11 to indicate that they would not actually be visible in an exterior view (e.g., the side view of FIG. 11).

As with the embodiment illustrated in FIG. 10, vertically aligned pairs of device-to-edge conductors 1114, 1124 each are electrically coupled together through a sidewall conductor 1130-1133. In addition, each pair of adjacent sidewall conductors 1130-1133 is electrically insulated from each other with an intra-conductor insulating structure 1140-1142. However, in FIG. 11, the overlapping and underlapping relationship between the intra-conductor insulation structures 1140-1142 and the sidewall conductors 1130-1133 is slightly different from the relationship illustrated in FIG. 10. More particularly, in FIG. 11, each sidewall conductor 1130-1133 is either overlapped by each adjacent intra-conductor insulating structure 1140-1142 or underlapped by each adjacent intra-conductor insulating structure 1140-1142. For example, sidewall conductors 1130 and 1132 both are overlapped by adjacent intra-conductor insulating structures 1140-1142, and neither of the sidewall conductors 1130, 1132 overlap an intra-conductor insulating structure 1140-1142. In contrast, sidewall conductors 1131 and 1133 both overlap adjacent intra-conductor insulating structures 1140-1142, and neither of the sidewall conductors 1131, 1133 underlap an intra-conductor insulating structure 1140-1142. Although the distinction between FIGS. 10 and 11 may appear to be subtle, the embodiment of FIG. 11 may take relatively less time to manufacture than the embodiment of FIG. 10, as will be made clear in conjunction with the description of FIG. 12.

FIG. 12 is a flowchart of a method for forming adjacent sidewall conductors with intra-conductor insulating structures, according to an embodiment. In order to better understand the method, FIG. 12 should be viewed in conjunction with FIG. 13, which includes cross-sectional views 1303, 1307, 1311 of a portion of the stacked microelectronic package assembly 1100 (FIG. 11) along line 13-13 during several stages of manufacture that correspond with the process blocks of FIG. 12.

The method may begin with a partially-completed, stacked microelectronic package assembly. For example, the partially-completed, stacked microelectronic package assembly may include first and second microelectronic packages (e.g., packages 1110, 1120, FIG. 11) which are bonded together in a stacked orientation. Each of the microelectronic packages includes a microelectronic device electrically coupled with a first plurality of device-to-edge conductors with ends or sidewall pads that coincide with a package sidewall. For example, as shown in view 1303, which represents a cross-sectional view of microelectronic package 1120, FIG. 11, the microelectronic package includes device-to-edge conductors 1124, which have ends or sidewall pads that coincide with package sidewall 1120.

In block 1202, and as shown in view 1303, a first set of package sidewall conductors 1130, 1132 may be formed so that each sidewall conductor 1130, 1132 contacts a device-to-edge conductor 1124, and also contacts one or more other device-to-edge conductors (e.g., device-to-edge conductors 1114, FIG. 11). For example, according to an embodiment, the first set of package sidewall conductors 1130, 1132 may include package sidewall conductors that are not directly adjacent to each other. In a more specific example, the first set of package sidewall conductors 1130, 1132 may include "every other" package sidewall conductor, meaning that other package sidewall conductors to be formed at a later stage ultimately will be located between the package sidewall conductors 1130, 1132 in the first set.

As mentioned previously, the package sidewall conductors 1130, 1132 may be formed from any of various suitable conductive materials or their combinations, which may be applied on the package sidewall surface 1120 using any of a number of dispensing techniques. In addition, in block 1204, the first set of package sidewall conductors 1130, 1132 optionally may be cured before advancing to the next processing stage. As used herein, the term "cure" means any process that causes deposited material to harden into a resilient solid structure, including sintering, exposing the material to chemical additives and/or gasses, and exposing the material to ultraviolet radiation, electron beams, or elevated temperatures.

In block 1206, and as shown in view 1307, intra-conductor insulating structures 1140, 1141, 1142 are formed adjacent to and partially overlapping each of the first set of package sidewall conductors 1130, 1132. For example, view 1307 shows intra-conductor insulating structure 1140 being formed adjacent to and overlapping the right edge of package sidewall conductor 1130, and also shows intra-conductor insulating structures 1141, 1142 being formed adjacent to and overlapping both the left and right edges of package sidewall conductor 1132. Only one intra-conductor insulating structure 1140 is formed adjacent to package sidewall conductor 1130, since there will be no future formed package sidewall conductor to the left of package sidewall conductor 1130 (and thus no other package sidewall conductor from which package sidewall conductor 1130 should be insulated from). According to an embodiment, the intra-conductor insulating structures 1140-1142 partially overlap the each of the first set of package sidewall conductors 1130, 1132 along an entire length of the package sidewall conductors 1130, 1132 that may be adjacent to another, future formed package sidewall conductor (e.g., package sidewall conductors 1131, 1133).

As discussed previously, the intra-conductor insulating structures 1140-1142 may be formed from any of various suitable electrically insulating materials or their combinations. In various embodiments, the insulating materials may be applied on the package sidewall surface 1120 by spraying, inkjet and/or aerosol jet printing, stencil printing, needle dispense, or another dispensing method. In addition, in block 1208, the intra-conductor insulating structures 1140-1142 optionally may be cured before advancing to the next processing stage.

In block 1210, and as shown in view 1311, a second set of package sidewall conductors 1131, 1133 may be formed so that each sidewall conductor 1131, 1133 contacts and extends between another set of device-to-edge conductors 1124, 1114, FIG. 11. For example, according to an embodiment, the second set of package sidewall conductors 1131, 1133 may include package sidewall conductors that are not directly adjacent to each other, but that are adjacent to the first set of package sidewall conductors 1130, 1132. In addition, the second set of package sidewall conductors 1131, 1133 may partially overlap the intra-conductor insulating structures 1140-1142. For example, as shown in view 1311, package sidewall conductor 1131 partially overlaps intra-conductor insulating structures 1140, 1141, and package sidewall conductor 1133 partially overlaps intra-conductor insulating structure 1142. Given the overlapping and underlapping relationships between adjacent package sidewall conductors 1130-1132 and intra-conductor insulating structures 1140-1142, the intra-conductor insulating structures 1140-1142 may provide substantial electrical insulation between adjacent package sidewall conductors 1130-1133, even when the pitches between the adjacent package sidewall conductors 1130-1133 is relatively small.

As with the first set of package sidewall conductors 1130, 1132, the second set of package sidewall conductors 1131, 1133 may be formed from any of various suitable conductive materials or their combinations, which may be applied on the package sidewall surface 1120 by any of various techniques. In addition, in block 1212, the second set of package sidewall conductors 1131, 1133 optionally may be cured. As discussed above, a curing process may be performed after each material deposition process. In an alternate embodiment, curing steps 1204 and or 1208 may be eliminated, and all of the deposited materials may be cured during the final curing process in block 1212.

According to another alternate embodiment, when additional sidewall pads are available for interconnection, additional intra-conductor insulating structures (referred to as "insulating pedestals," herein) and additional package sidewall conductors (referred to as "elevated sidewall conductors," herein) may be deposited over a first set of package sidewall conductors and intra-conductor insulating structures. For example, FIG. 14 illustrates an enlarged, side view of a portion of a stacked microelectronic package assembly 1400, according to such another embodiment.

Figure 14:
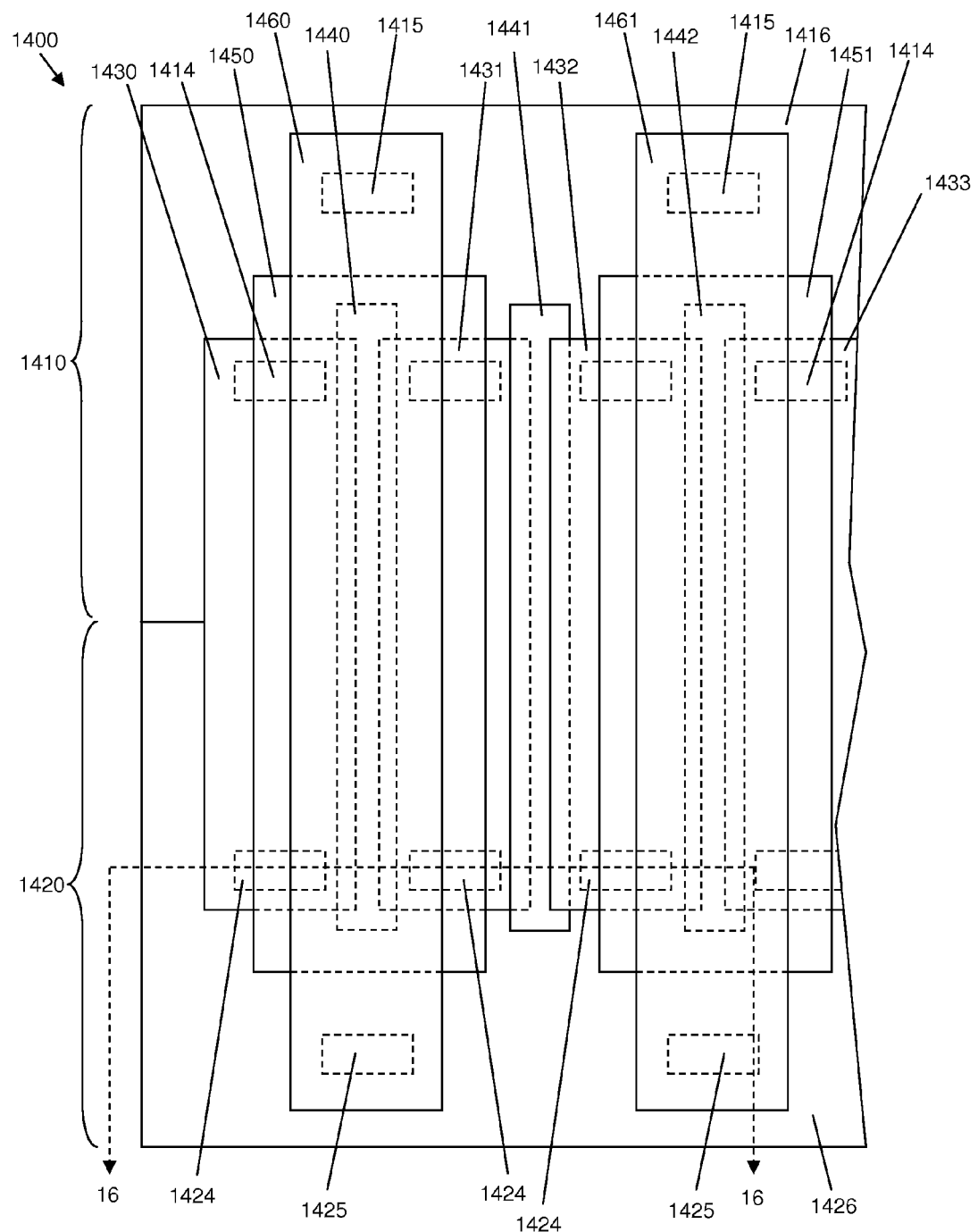
FIG. 14 illustrates an enlarged, side view of a portion of a stacked microelectronic package assembly, according to another embodiment.

The embodiment of FIG. 14 is similar to the embodiment of FIG. 11, in that stacked microelectronic package assembly 1400 includes a plurality of sidewall conductors 1430, 1431, 1432, 1433 and intra-conductor insulating structures 1440, 1441, 1442 that directly contact the package sidewalls 1416, 1426, according to an embodiment. More specifically, FIG. 14 illustrates a stacked microelectronic package assembly 1400 that includes first and second microelectronic packages 1410, 1420, which are bonded together in a stacked orientation. The first microelectronic package 1410 includes a first microelectronic device (not illustrated) electrically coupled with a first plurality of device-to-edge conductors 1414 with ends or sidewall pads that coincide with package sidewall 1416. Similarly, the second microelectronic package 1420 includes a second microelectronic device (not illustrated) electrically coupled with a second plurality of device-to-edge conductors 1424 with ends or sidewall pads that coincide with package sidewall 1426. The sidewall pads of the device-to-edge conductors 1414, 1424 and overlapped portions of the sidewall conductors 1430, 1432 and intra-conductor insulating structures 1440-1442 are illustrated using dashed lines in FIG. 14 to indicate that they would not actually be visible in an exterior view (e.g., the side view of FIG. 14).

As with the embodiment illustrated in FIG. 11, vertically aligned pairs of device-to-edge conductors 1414, 1424 each are electrically coupled together through a sidewall conductor 1430-1433. In addition, each pair of adjacent sidewall conductors 1430-1433 is electrically insulated from each other with an intra-conductor insulating structure 1440-1442. However, the embodiment of FIG. 14, the stacked microelectronic package assembly 1400 also includes additional, vertically aligned device-to-edge conductors 1415, 1425 that are located above and below (from the perspective of FIG. 14) device-to-edge conductors 1414, 1424, respectively. In addition, stacked microelectronic package assembly 1400 also includes additional intra-conductor insulating structures or insulating pedestals 1450, 1451 deposited over intra-conductor insulating structures 1440, 1442 and portions of package sidewall conductors 1430-1433, along with additional package sidewall conductors or elevated sidewall conductors 1460, 1461 deposited over the insulating pedestals 1450, 1451 and electrically interconnecting the additional device-to-edge conductors 1415, 1425.

Figure 15:
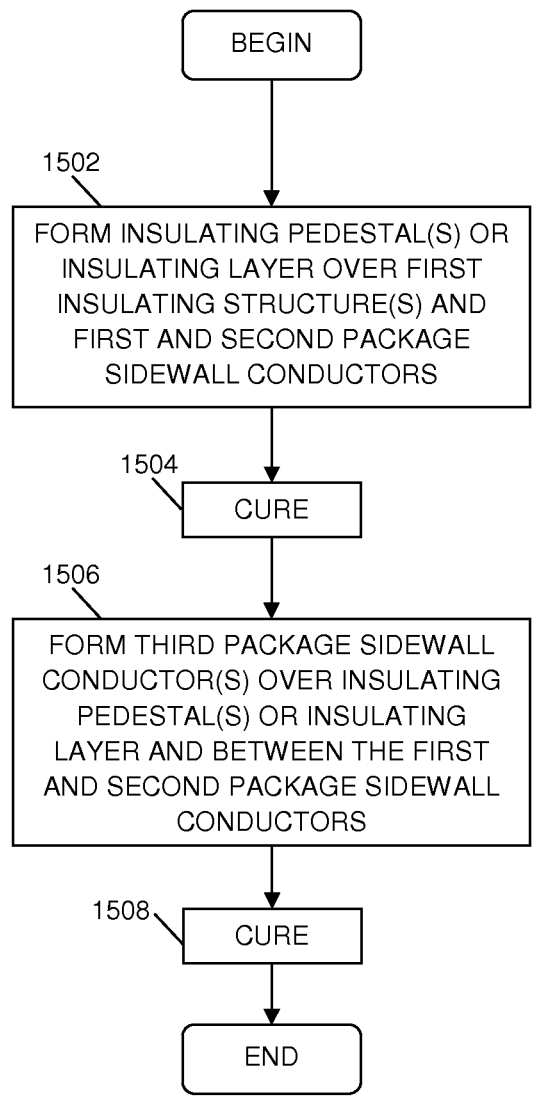
FIG. 15 is a flowchart of a method for forming adjacent sidewall conductors with an intra-conductor insulating structure, according to another embodiment.
Figure 16:
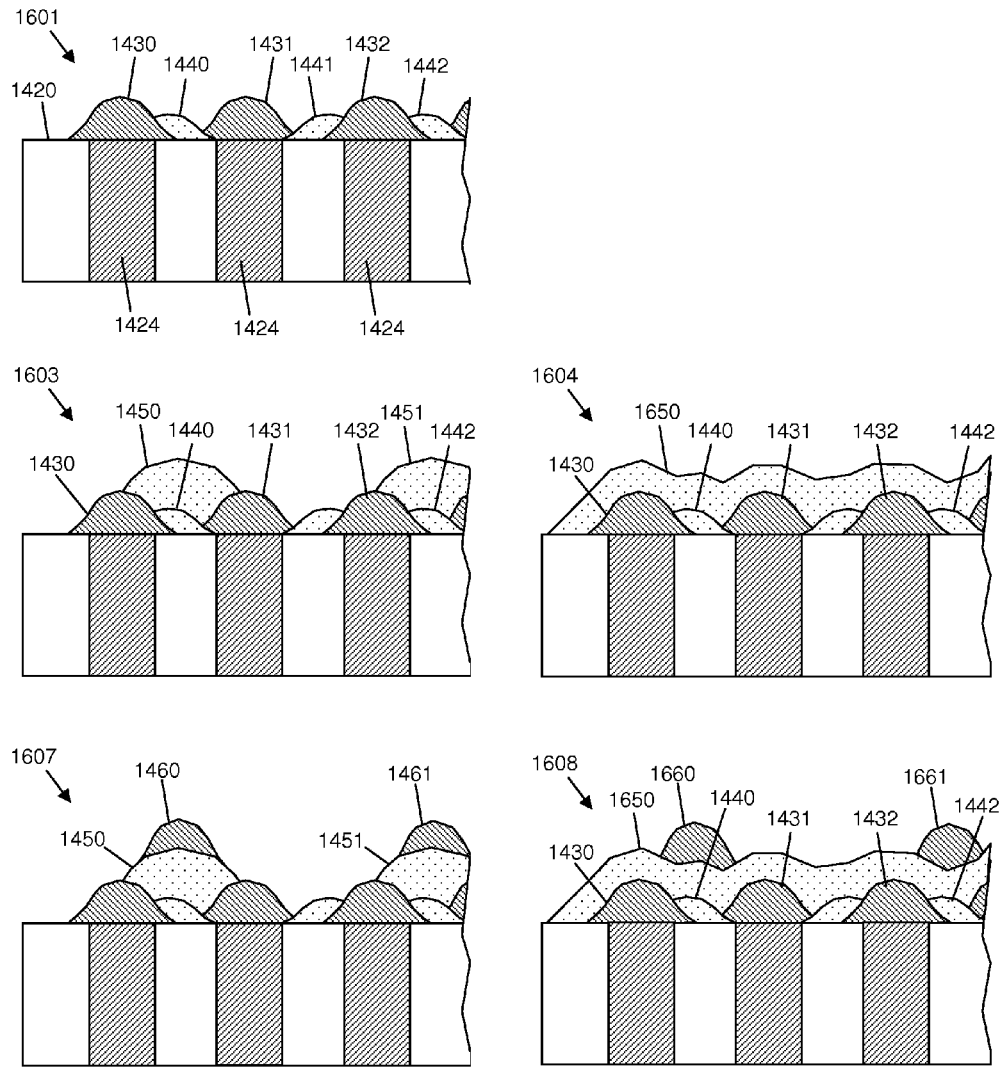
FIG. 16 illustrates cross-sectional side views of a portion of a stacked microelectronic package assembly at various stages of manufacture that correspond with the steps of the flowchart of FIG. 15, according to another embodiment.

FIG. 15 is a flowchart of a method for forming adjacent sidewall conductors with intra-conductor insulating structures, according to an embodiment. In order to better understand the method, FIG. 15 should be viewed in conjunction with FIG. 16, which includes cross-sectional views 1601, 1603, 1607 of a portion of the stacked microelectronic package assembly 1600 (FIG. 16) along line 16-16 during several stages of manufacture that correspond with the process blocks of FIG. 15.

The method may begin, as shown in view 1601, with a partially-completed, stacked microelectronic package assembly at manufacturing stage that is similar to the stage corresponding to view 1311 (FIG. 13) of the stacked microelectronic package 1100 of FIG. 11. For example, the partially-completed, stacked microelectronic package assembly may include first and second microelectronic packages (e.g., packages 1410, 1420, FIG. 14) which are bonded together in a stacked orientation. Each of the microelectronic packages includes a microelectronic device electrically coupled with a first plurality of device-to-edge conductors with ends or sidewall pads that coincide with a package sidewall. For example, as shown in view 1601, which represents a cross-sectional view of microelectronic package 1420, FIG. 14, the microelectronic package includes device-to-edge conductors 1424, which have ends or sidewall pads that coincide with package sidewall 1420. In addition, according to an embodiment, the partially-completed, stacked microelectronic assembly includes sidewall conductors 1430-1433 that electrically couple pairs of device-to-edge conductors 1414, 1424, and intra-conductor insulating structures 1440-1442 that electrically insulate adjacent sidewall conductors 1430-1433.

In block 1502, and as shown in view 1603, insulating pedestals 1450, 1451 are formed over intra-conductor insulating structures 1440, 1442 and partially overlapping each of the sidewall conductors 1430-1433. In the illustrated embodiment, an insulating pedestal is not formed over intra-conductor insulating structure 1441, although it could be, in another embodiment. Insulating pedestals 1450, 1451 may be formed from any of various suitable electrically insulating materials or their combinations, including materials that are the same as or different from the materials used for intra-conductor insulating structures 1440-1442. In various embodiments, the insulating materials from which insulating pedestals 1450, 1451 are formed may be applied over the intra-conductor insulating structures 1440, 1442 and the sidewall conductors 1430-1433 by spraying, inkjet and/or aerosol jet printing, stencil printing, needle dispense, or another dispensing method. In the embodiment shown in view 1603, the insulating pedestals 1450, 1451 are depicted as discrete structures (i.e., structures that are physically distinct from each other). In an alternate embodiment, as shown in view 1604, the discrete insulating pedestals 1450, 1451 could be replaced with a continuous insulating material layer 1650 (e.g., a conformal coating of the insulating material, which also may be considered to be an "intra-conductor insulating structure") applied over the intra-conductor insulating structures 1440, 1442 and the sidewall conductors 1430-1433. In either embodiment, in block 1504, the insulating pedestals 1450, 1451 or the insulating material layer 1650 optionally may be cured before advancing to the next processing stage.

In block 1506, and as shown in view 1607, additional package sidewall conductors or elevated sidewall conductors 1460, 1461 are formed over the insulating pedestals 1450, 1451 so that each elevated sidewall conductor 1460, 1461 contacts a pair of the additional device-to-edge conductors 1415, 1425 (FIG. 14), but does not contacts the underlying sidewall conductors 1430-1433. As with the underlying sidewall conductors 1430-1433, the elevated sidewall conductors 1460, 1461 may be formed from any of various suitable conductive materials or their combinations, which may be applied on the insulating pedestals 1450, 1451 using any of a number of dispensing techniques. In the alternate embodiment discussed above in conjunction with view 1604, elevated sidewall conductors 1660, 1661 alternatively could be formed on the insulating material layer 1650, as shown in view 1608. In either embodiment, in block 1508, the elevated sidewall conductors 1460, 1461 or 1660, 1661 optionally may be cured. In an alternate embodiment, curing step 1504 may be eliminated, and all of the deposited materials may be cured during the final curing process in block 1508.

Figure 17:
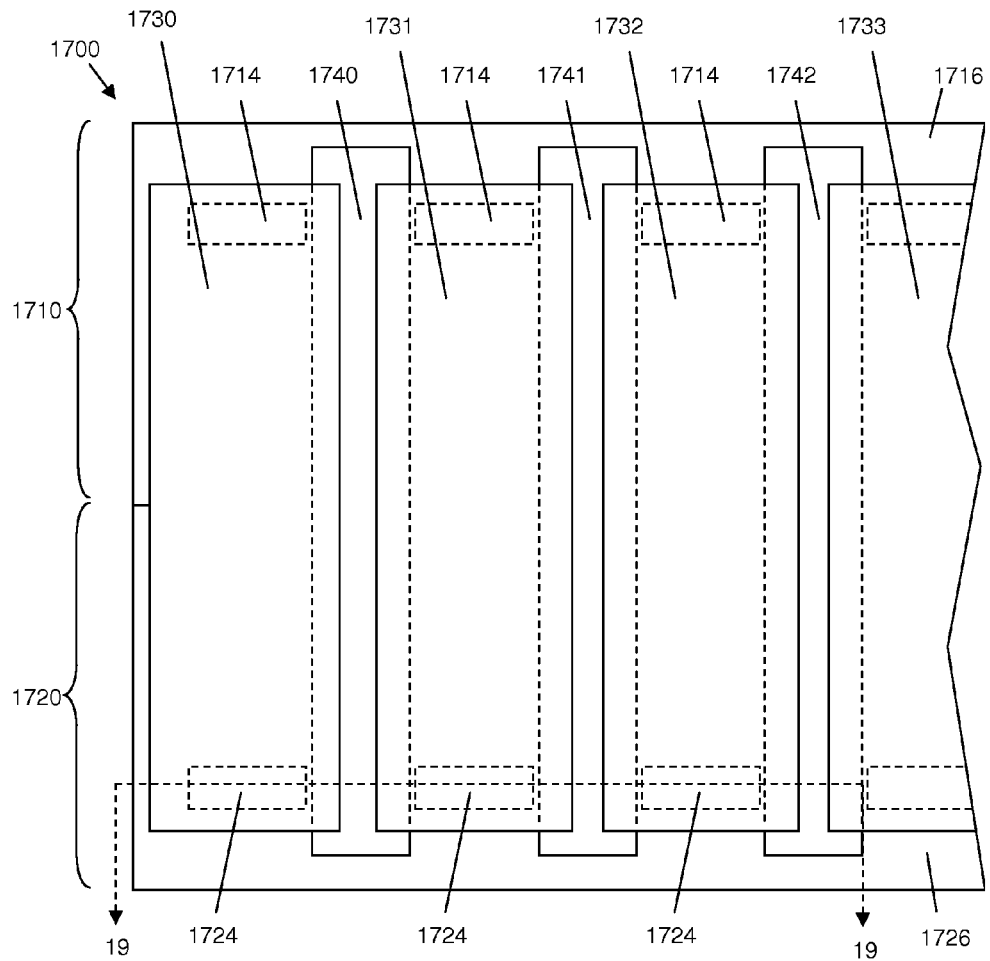
FIG. 17 illustrates an enlarged, side view of a portion of a stacked microelectronic package assembly, according to another embodiment.

FIG. 17 illustrates an enlarged, side view of a portion of a stacked microelectronic package assembly 1700, according to yet another alternate embodiment. The embodiment of FIG. 17 is similar to the embodiment of FIG. 10, in that stacked microelectronic package assembly 1700 includes a plurality of sidewall conductors 1730, 1731, 1732, 1733 and intra-conductor insulating structures 1740, 1741, 1742, according to an embodiment. More specifically, FIG. 17 illustrates a stacked microelectronic package assembly 1700 that includes first and second microelectronic packages 1710, 1720, which are bonded together in a stacked orientation. The first microelectronic package 1710 includes a first microelectronic device (not illustrated) electrically coupled with a first plurality of device-to-edge conductors 1714 with ends or sidewall pads that coincide with package sidewall 1716. Similarly, the second microelectronic package 1720 includes a second microelectronic device (not illustrated) electrically coupled with a second plurality of device-to-edge conductors 1724 with ends or sidewall pads that coincide with package sidewall 1726. The sidewall pads of the device-to-edge conductors 1714, 1724 and overlapped portions of the sidewall conductors 1730, 1732 and intra-conductor insulating structures 1740-1742 are illustrated using dashed lines in FIG. 17 to indicate that they would not actually be visible in an exterior view (e.g., the side view of FIG. 17).

As with the embodiment illustrated in FIG. 10, vertically aligned pairs of device-to-edge conductors 1714, 1724 each are electrically coupled together through a sidewall conductor 1730-1733. In addition, each pair of adjacent sidewall conductors 1730-1733 is electrically insulated from each other with an intra-conductor insulating structure 1740-1742. However, in FIG. 17, the overlapping and underlapping relationship between the intra-conductor insulation structures 1740-1742 and the sidewall conductors 1730-1733 again is slightly different from the relationship illustrated in FIG. 10. More particularly, in FIG. 17, each sidewall conductor 1730-1733 is underlapped by each adjacent intra-conductor insulating structure 1740-1742. For example, sidewall conductors 1730 is underlapped along its right edge by intra-conductor insulating structure 1740, and sidewall conductors 1731 and 1732 both are underlapped along both edges by adjacent intra-conductor insulating structures 1740-1742. Again, although the distinction between FIGS. 10 and 17 may appear to be subtle, the embodiment of FIG. 17 may take relatively less time to manufacture than the embodiment of FIG. 10, as will be made clear in conjunction with the description of FIG. 18.

Figure 18:
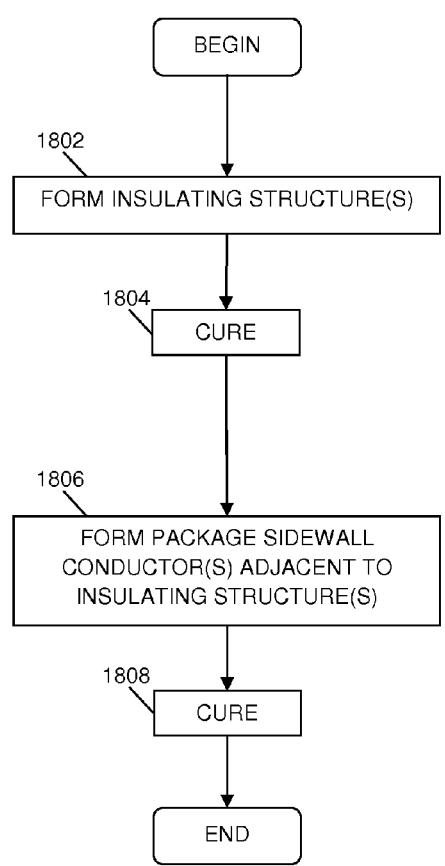
FIG. 18 is a flowchart of a method for forming adjacent sidewall conductors with an intra-conductor insulating structure, according to another embodiment.
Figure 19:
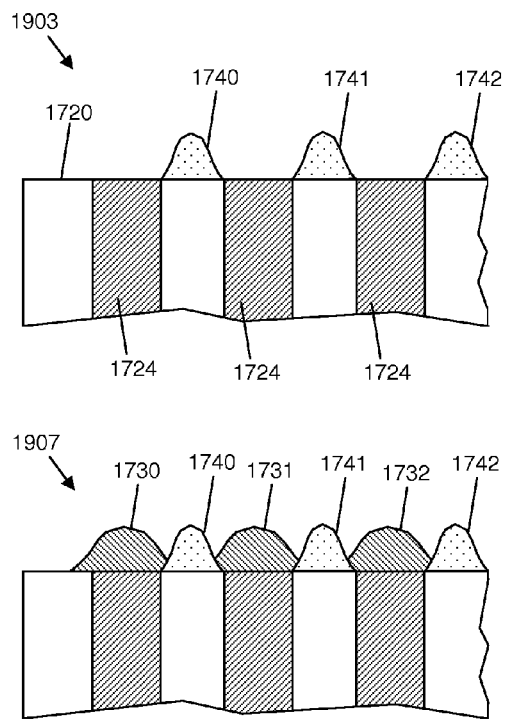
FIG. 19 illustrates cross-sectional side views of a portion of a stacked microelectronic package assembly at various stages of manufacture that correspond with the steps of the flowchart of FIG. 18, according to another embodiment.

FIG. 18 is a flowchart of a method for forming adjacent sidewall conductors with intra-conductor insulating structures, according to an embodiment. In order to better understand the method, FIG. 18 should be viewed in conjunction with FIG. 19, which includes cross-sectional views 1903, 1907 of a portion of the stacked microelectronic package assembly 1700 (FIG. 17) along line 19-19 during several stages of manufacture that correspond with the process blocks of FIG. 18.

The method may begin with a partially-completed, stacked microelectronic package assembly. For example, the partially-completed, stacked microelectronic package assembly may include first and second microelectronic packages (e.g., packages 1710, 1720, FIG. 17) which are bonded together in a stacked orientation. Each of the microelectronic packages includes a microelectronic device electrically coupled with a first plurality of device-to-edge conductors with ends or sidewall pads that coincide with a package sidewall. For example, as shown in view 1903, which represents a cross-sectional view of microelectronic package 1720, FIG. 17, the microelectronic package includes device-to-edge conductors 1724, which have ends or sidewall pads that coincide with package sidewall 1720.

In block 1802, and as shown in view 1903, intra-conductor insulating structures 1740, 1741, 1742 are formed on the package sidewall 1720 between the device-to-edge conductors 1724, extending along an entire length of areas where future formed package sidewall conductors (e.g., package sidewall conductors 1730-1732) ultimately will be formed. As with the previously discussed embodiments, the intra-conductor insulating structures 1740-1742 may be formed from any of various suitable electrically insulating materials or their combinations. In various embodiments, the insulating materials may be applied on the package sidewall surface 1720 using any of a number of dispensing techniques. In addition, in block 1804, the intra-conductor insulating structures 1740-1742 optionally may be cured before advancing to the next processing stage.

In block 1806, and as shown in view 1907, package sidewall conductors 1730-1732 are formed adjacent to the intra-conductor insulation structures 1740-1742 so that each sidewall conductor 1730-1732 contacts a device-to-edge conductor 1724, and also contacts one or more other device-to-edge conductors (e.g., device-to-edge conductors 1714, FIG. 17). As with the previously described embodiments, the package sidewall conductors 1730-1732 may be formed from any of various suitable conductive materials or their combinations, which may be applied on the package sidewall surface 1720 using any of a number of dispensing techniques. In addition, in block 1808, the package sidewall conductors 1730-1732 optionally may be cured. In an alternate embodiment, curing step 1804 may be eliminated, and all of the deposited materials may be cured during the final curing process in block 1808.

Figure 20:
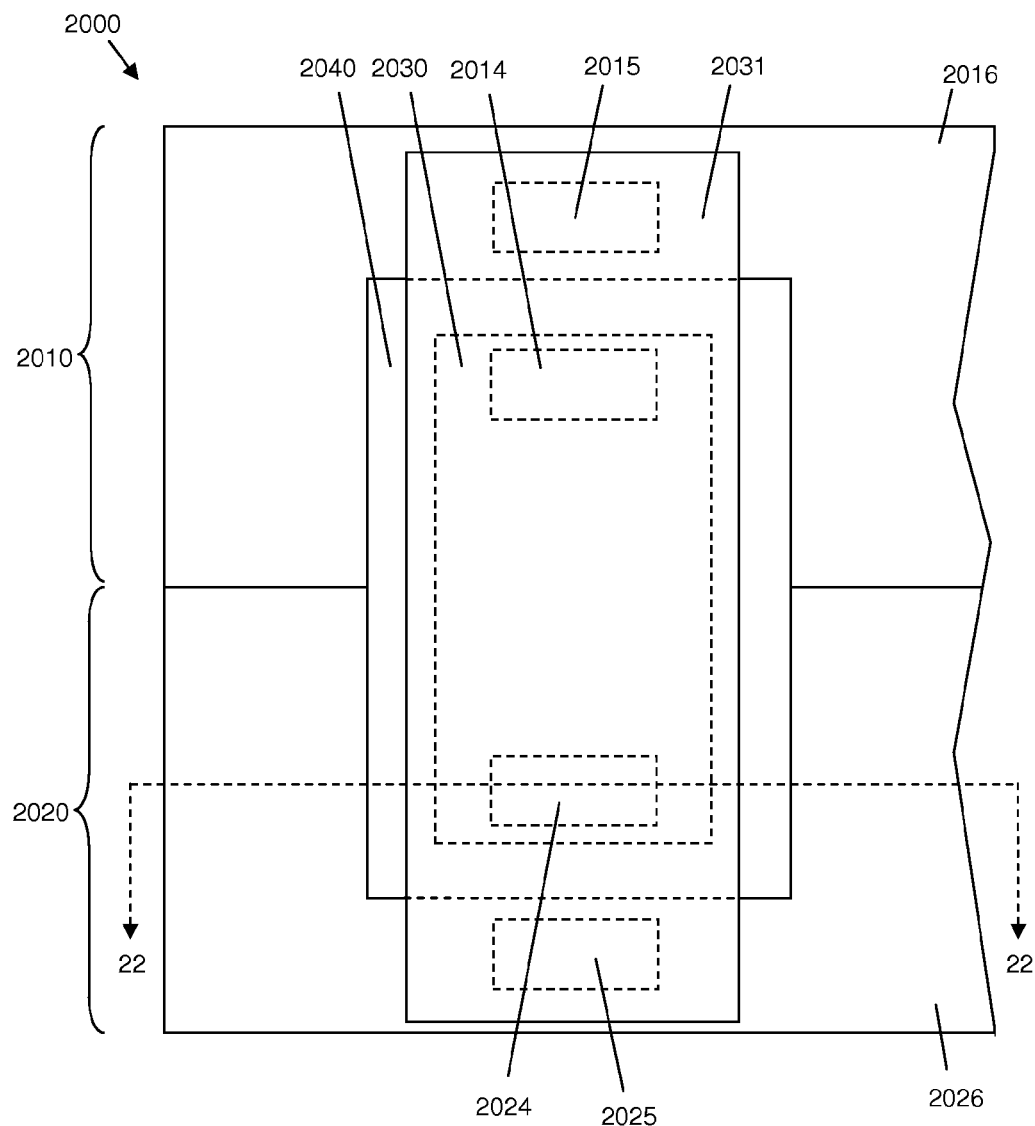
FIG. 20 illustrates an enlarged, side view of a portion of a stacked microelectronic package assembly, according to another embodiment.

FIG. 20 illustrates an enlarged, side view of a portion of a stacked microelectronic package assembly 2000, according to yet another embodiment. Stacked microelectronic package assembly 2000 includes a plurality of sidewall conductors 2030, 2031 and one or more intra-conductor insulating structures 2040, according to an embodiment. More specifically, FIG. 20 illustrates a stacked microelectronic package assembly 2000 that includes first and second microelectronic packages 2010, 2020, which are bonded together in a stacked orientation. The first microelectronic package 2010 includes a first microelectronic device (not illustrated) electrically coupled with one or more device-to-edge conductors 2014 with ends or sidewall pads that coincide with package sidewall 2016. Similarly, the second microelectronic package 2020 includes a second microelectronic device (not illustrated) electrically coupled with one or more device-to-edge conductors 2024 with ends or sidewall pads that coincide with package sidewall 2026. The sidewall pads of the device-to-edge conductors 2014, 2024, sidewall conductor 2030, and overlapped portions of the intra-conductor insulating structure 2040 are illustrated using dashed lines in FIG. 20 to indicate that they would not actually be visible in an exterior view (e.g., the side view of FIG. 20).

According to an embodiment, a vertically aligned pair of device-to-edge conductors 2014, 2024 is electrically coupled together through a sidewall conductor 2030. Similar to the embodiment described in conjunction with FIG. 14, stacked microelectronic package assembly 2000 also includes additional, vertically aligned device-to-edge conductors 2015, 2025 that are located above and below (from the perspective of FIG. 20) device-to-edge conductors 2014, 2024, respectively. In addition, stacked microelectronic package assembly 2000 also includes an intra-conductor insulating structure or insulating pedestal 2040 deposited over package sidewall conductor 2030, along with an additional package sidewall conductor or elevated sidewall conductor 2031 deposited over the insulating pedestal 2040 and electrically interconnecting the additional device-to-edge conductors 2015, 2025. Although FIG. 20 depicts only one stacked interconnect structure between the device-to-edge conductors 2014, 2015, 2024, 2025, it is to be understood that a stacked microelectronic package assembly may include multiple instances of such an interconnect structure. Further, although FIGS. 21 and 22 depict an embodiment of a method for forming a single stacked interconnect structure, it is to be understood that multiple instances of such an interconnect structure simultaneously may be formed.

Figure 21:
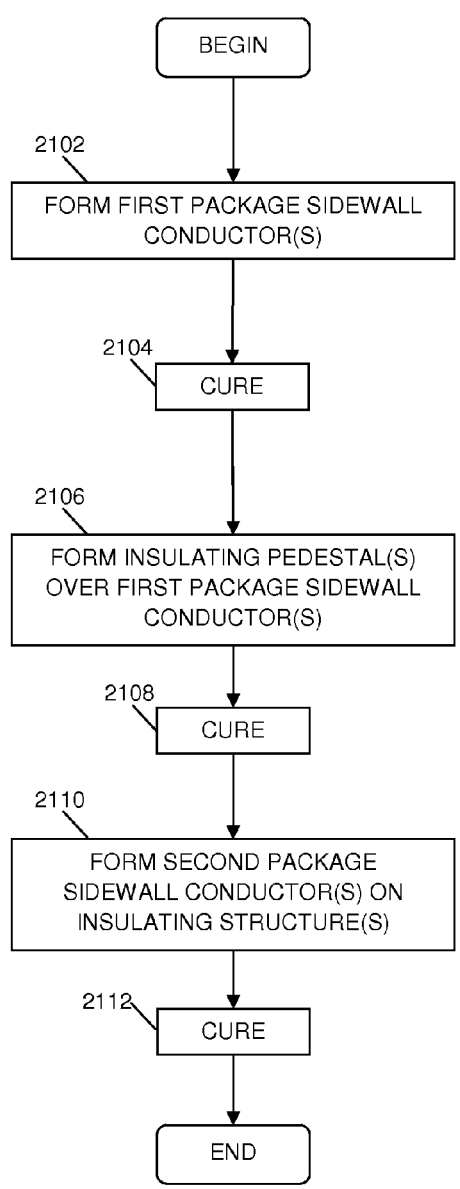
FIG. 21 is a flowchart of a method for forming adjacent sidewall conductors with an intra-conductor insulating structure, according to another embodiment.
Figure 22:
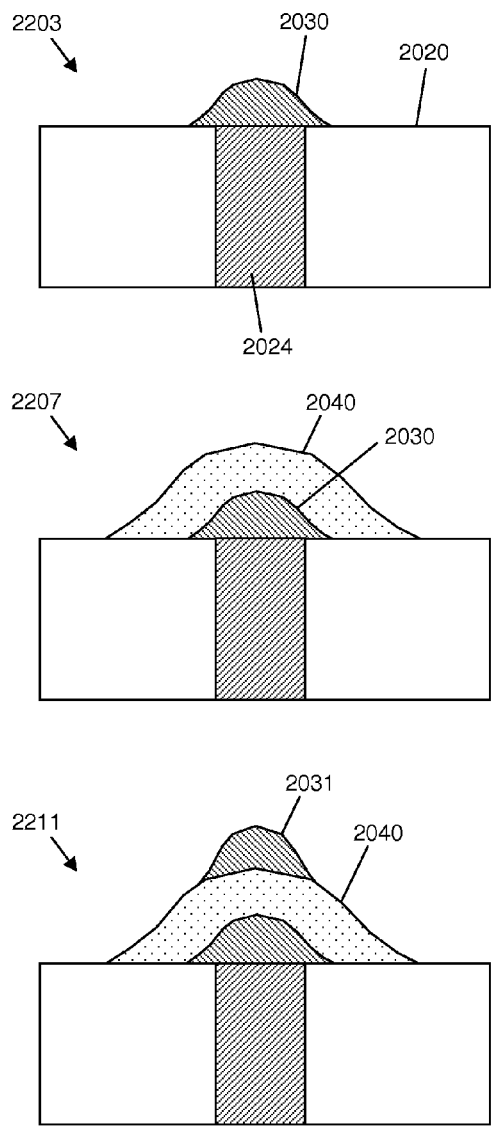
FIG. 22 illustrates cross-sectional side views of a portion of a stacked microelectronic package assembly at various stages of manufacture that correspond with the steps of the flowchart of FIG. 21, according to another embodiment.

FIG. 21 is a flowchart of a method for forming adjacent sidewall conductors with intra-conductor insulating structures, according to an embodiment. In order to better understand the method, FIG. 21 should be viewed in conjunction with FIG. 22, which includes cross-sectional views 2203, 2207, 2211 of a portion of the stacked microelectronic package assembly 2000 (FIG. 20) along line 22-22 during several stages of manufacture that correspond with the process blocks of FIG. 21.

The method may begin with a partially-completed, stacked microelectronic package assembly. For example, the partially-completed, stacked microelectronic package assembly may include first and second microelectronic packages (e.g., packages 2010, 2020, FIG. 20) which are bonded together in a stacked orientation. Each of the microelectronic packages includes a microelectronic device electrically coupled with a first plurality of device-to-edge conductors with ends or sidewall pads that coincide with a package sidewall. For example, as shown in view 2203, which represents a cross-sectional view of microelectronic package 2020, FIG. 20, the microelectronic package includes device-to-edge conductors 2024, which have ends or sidewall pads that coincide with package sidewall 2020.

In block 2102, and as shown in view 2203, a first or lower package sidewall conductor 2030 is formed so that the sidewall conductor 2030 contacts a device-to-edge conductor 2024, and also contacts one or more other device-to-edge conductors (e.g., device-to-edge conductors 2014, FIG. 20). As with the previously described embodiments, the lower package sidewall conductor 2030 may be formed from any of various suitable conductive materials or their combinations, which may be applied on the package sidewall surface 2020 using any of a number of dispensing techniques. In addition, in block 2104, the lower package sidewall conductor 2030 optionally may be cured before advancing to the next processing stage.

In block 2106, and as shown in view 2207, an intra-conductor insulating structure or insulating pedestal 2040 is formed over the lower package sidewall conductor 2030, in contact with the package sidewall 2020, and extending along an entire length of the lower package sidewall conductor 2030. As with the previously discussed embodiments, the insulating pedestal 2040 may be formed from any of various suitable electrically insulating materials or their combinations. In various embodiments, the insulating materials may be applied on the lower package sidewall conductor 2030 and the package sidewall surface 2020 using any of a number of dispensing techniques. In addition, in block 2108, the insulating pedestal 2040 optionally may be cured before advancing to the next processing stage.

In block 2110, and as shown in view 2211, a second or upper package sidewall conductor 2031 is formed on the insulating pedestal 2040. Although the upper package sidewall conductor 2031 is formed above the lower package sidewall conductor 2030, with respect to the surface of the package sidewall 2020, the lower and upper package sidewall conductors 2030, 2031 and the insulating pedestal 2040 may still be considered to be "adjacent to" each other, as that term is used herein. The upper package sidewall conductor 2031 is formed so that it contacts at least two additional device-to-edge conductors (e.g., device-to-edge conductors 2015, 2025, FIG. 20). As with the previously described embodiments, the upper package sidewall conductor 2031 may be formed from any of various suitable conductive materials or their combinations, which may be applied on the insulating pedestal 2040 using any of a number of dispensing techniques. In addition, in block 2112, the upper package sidewall conductor 2031 optionally may be cured. In an alternate embodiment, curing steps 2104 and 2108 may be eliminated, and all of the deposited materials may be cured during the final curing process in block 2112.

Although the various embodiments illustrated in the Figures and described above include vertically-oriented package sidewall conductors that interconnect vertically aligned sidewall pads of stacked packages, other embodiments also or alternatively may include horizontally-oriented package sidewall conductors that interconnect horizontally aligned sidewall pads of a single microelectronic package or multiple microelectronic packages. In addition, other embodiments may include package sidewall conductors that interconnect sets of more than two sidewall pads, and/or package sidewall conductors having shapes that are different from simple linear shapes, as discussed previously. Further, in some embodiments, adjacent sidewall conductors may couple to one or more common sidewall pads. In addition, in still other alternate embodiments, a stacked microelectronic package assembly may include any number or combination of the package sidewall conductor and intra-conductor insulating structure embodiments discussed herein. All such embodiments are intended to be included within the scope of the inventive subject matter.

An embodiment of a device includes a package body and multiple pads. The package body has a package surface, and the multiple pads are exposed at the package surface and are electrically coupled to one or more electrical components embedded within the package body. The device also includes first and second package surface conductors and an intra-conductor insulating structure. The first package surface conductor is coupled to the package surface and has a first elongated portion. The first package surface conductor extends between and electrically couples a first set of the pads. The second package surface conductor is coupled to the package surface and has a second elongated portion. The first and second elongated portions are parallel with and adjacent to each other, and the second package surface conductor extends between and electrically couples a second set of the pads. The intra-conductor insulating structure is coupled between the first and second package surface conductors along an entirety of the first and second elongated portions of the first and second package surface conductors. The intra-conductor insulating structure is configured to electrically insulate the first and second elongated portions of the first and second package surface conductors from each other.

An embodiment of a stacked microelectronic package includes first and second microelectronic packages, first and second sidewall conductors, and an intra-conductor insulating structure. The first microelectronic package has a first package sidewall, an embedded first microelectronic device, and a first device-to-edge conductor between the first microelectronic device and the first package sidewall. An end of the first device-to-edge conductor that is exposed at the first package sidewall defines a first sidewall pad. The second microelectronic package is vertically stacked on the first microelectronic package and has a second package sidewall, an embedded second microelectronic device, and a second device-to-edge conductor between the second microelectronic device and the second package sidewall. An end of the second device-to-edge conductor that is exposed at the second package sidewall defines a second sidewall pad. The first sidewall conductor is coupled to the first and second package sidewalls and has a first elongated portion. The first sidewall conductor extends between and electrically couples the first and second sidewall pads. The second sidewall conductor is coupled to either or both of the first and second package sidewalls and has a second elongated portion. The first and second elongated portions are parallel with and adjacent to each other, and the second sidewall conductor extends between and electrically couples third and fourth sidewall pads. The intra-conductor insulating structure is coupled between the first and second sidewall conductors along an entirety of the first and second elongated portions of the first and second sidewall conductors. The intra-conductor insulating structure is configured to electrically insulate the first and second elongated portions of the first and second sidewall conductors from each other.

An embodiment of a method includes coupling a first package surface conductor to a package surface, coupling a second package surface conductor to the package surface, and coupling a intra-conductor insulating structure between the first and second package surface conductors. The first package surface conductor has a first elongated portion, and the first package surface conductor extends between and electrically couples a first set of pads that are exposed at the package surface. The second package surface conductor has a second elongated portion, the first and second elongated portions are parallel with and adjacent to each other, and the second package surface conductor extends between and electrically couples a second set of pads that are exposed at the package surface. The intra-conductor insulating structure is coupled between the first and second package surface conductors along an entirety of the first and second elongated portions of the first and second package surface conductors. The intra-conductor insulating structure is configured to electrically insulate the first and second elongated portions of the first and second package surface conductors from each other.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical (e.g., mechanical) manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

While at least one embodiment has been presented in the foregoing Detailed Description, it should be appreciated that a vast number of variations exist. It should also be appreciated that the embodiment or embodiments are only examples, and are not intended to limit the scope, applicability, or configuration of the disclosure in any way. Rather, the foregoing Detailed Description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A device, comprising: a package body having a package surface; multiple pads that are exposed at the package surface and are electrically coupled to one or more electrical components embedded within the package body; a first package surface conductor coupled to the package surface and having a first elongated portion, wherein the first package surface conductor extends between and electrically couples a first set of the pads; a second package surface conductor coupled to the package surface and having a second elongated portion, wherein the first and second elongated portions are parallel with and adjacent to each other, and wherein the second package surface conductor extends between and electrically couples a second set of the pads; and a first intra-conductor insulating structure coupled between the first and second package surface conductors along an entirety of the first and second elongated portions of the first and second package surface conductors, wherein the first intra-conductor insulating structure is configured to electrically insulate the first and second elongated portions of the first and second package surface conductors from each other; the one or more electrical components include a first microelectronic device embedded within a first microelectronic package having a first sidewall, and a second microelectronic device embedded within a second microelectronic package having a second sidewall; the first and second microelectronic packages are stacked in a vertical arrangement; the first set of pads includes a first sidewall pad and a second sidewall pad, wherein the first sidewall pad is positioned at the first sidewall and is electrically coupled with the first microelectronic device through a first device-to-edge conductor, and the second sidewall pad is positioned at the second sidewall and is electrically coupled with the second microelectronic device through a second device-to-edge conductor.

2. The device of claim 1, wherein the first set of pads include multiple sidewall pads positioned at a sidewall of a single microelectronic package.

3. The device of claim 1, wherein the first and second elongated portions of the first and second package surface conductors are deposited directly on a package sidewall.

4. The device of claim 1, wherein the first elongated portion of the first package surface conductor is deposited directly on a package sidewall, and the second elongated portion of the second package surface conductor is not deposited directly on the package sidewall, but instead is deposited on the first intra-conductor insulating structure above the package sidewall and above the first elongated portion of the first package surface conductor.

5. The device of claim 1, wherein an edge of the first package surface conductor partially underlaps the first intra-conductor insulating structure, and an edge of the second package surface conductor partially overlaps the first intra-conductor insulating structure.

6. The device of claim 1, wherein edges of the first and second package surface conductors partially overlap the first intra-conductor insulating structure.

7. The device of claim 1, further comprising:
   a second intra-conductor insulating structure deposited on the first intra-conductor insulating structure and at least partially overlapping the first and second package surface conductors; and a third package surface conductor having a third elongated portion deposited on the second intra-conductor insulating structure above the package surface and above the first and second elongated portions of the first and second package surface conductors.

8. The device of claim 1, wherein the first and second package surface conductors are formed from one or more conductive materials selected from an electrically conductive adhesive, conductive polymer, a polymer filled with conductive particles, a metal alloy, metal coated organic particles, metal coated ceramic particles, solder paste, solder-filled adhesive, nanoparticle-filled ink, a liquid metal, a metal-containing adhesive, a metal-containing epoxies, electrically-conductive pastes, indium, and bismuth.

9. The device of claim 1, wherein the first intra-conductor insulating structure is formed from one or more non-conductive materials selected from an epoxy, silicone, a cyanide ester, acrylic, and a polymer adhesive.

10. A stacked microelectronic package, comprising: a first microelectronic package having a first package sidewall, an embedded first microelectronic device, and a first device-to-edge conductor between the first microelectronic device and the first package sidewall, wherein an end of the first device-to-edge conductor that is exposed at the first package sidewall defines a first sidewall pad; a second microelectronic package vertically stacked on the first microelectronic package and having a second package sidewall, an embedded second microelectronic device, and a second device-to-edge conductor between the second microelectronic device and the second package sidewall, wherein an end of the second device-to-edge conductor that is exposed at the second package sidewall defines a second sidewall pad; a first sidewall conductor coupled to the first and second package sidewalls and having a first elongated portion, wherein the first sidewall conductor extends between and electrically couples the first and second sidewall pads; a second sidewall conductor coupled to either or both of the first and second package sidewalls and having a second elongated portion, wherein the first and second elongated portions are parallel with and adjacent to each other, and wherein the second sidewall conductor extends between and electrically couples third and fourth sidewall pads; and a first intra-conductor insulating structure coupled between the first and second sidewall conductors along an entirety of the first and second elongated portions of the first and second sidewall conductors, wherein the first intra-conductor insulating structure is configured to electrically insulate the first and second elongated portions of the first and second sidewall conductors from each other; a second intra-conductor insulating structure deposited on the first intra-conductor insulating structure and at least partially overlapping the first and second sidewall conductors; and a third sidewall conductor having a third elongated portion deposited on the second intra conductor insulating structure above the first and second elongated portions of the first and second sidewall conductors.

11. The stacked microelectronic package of claim 10, wherein the first and second elongated portions of the first and second sidewall conductors are deposited directly on a package sidewall.

12. The stacked microelectronic package of claim 10, wherein the first elongated portion of the first sidewall conductor is deposited directly on a package sidewall, and the second elongated portion of the second sidewall conductor is not deposited directly on the package sidewall, but instead is deposited on the first intra-conductor insulating structure above the package sidewall and above the first elongated portion of the first sidewall conductor.

13. A method comprising: coupling a first package surface conductor to a package surface, wherein the first package surface conductor has a first elongated portion, and the first package surface conductor extends between and electrically couples a first set of pads that are exposed at the package surface; coupling a second package surface conductor to the package surface, wherein the second package surface conductor has a second elongated portion, the first and second elongated portions are parallel with and adjacent to each other, and the second package surface conductor extends between and electrically couples a second set of pads that are exposed at the package surface; and coupling a intra-conductor insulating structure between the first and second package surface conductors along an entirety of the first and second elongated portions of the first and second package surface conductors, wherein the intra-conductor insulating structure is configured to electrically insulate the first and second elongated portions of the first and second package surface conductors from each other; stacking a first microelectronic package that has a first sidewall on a second microelectronic package that has a second sidewall, wherein the first microelectronic package includes an embedded first microelectronic device that is electrically coupled with a first sidewall pad of the first set of pads, and the second microelectronic package includes an embedded second microelectronic device that is electrically coupled with a second sidewall pad of the first set of pads.

14. The method of claim 13, wherein coupling the first and second package surface conductors to the package surface comprises dispensing one or more conductive materials on the package surface using one or more dispensing methods selected from spraying, inkjet printing, aerosol jet printing, stencil printing, and needle dispense.

15. The method of claim 14, wherein the one or more conductive materials are selected from an electrically conductive adhesive, conductive polymer, a polymer filled with conductive particles, a metal alloy, metal coated organic particles, metal coated ceramic particles, solder paste, solder-filled adhesive, nanoparticle-filled ink, a liquid metal, a metal-containing adhesive, a metal-containing epoxies, electrically-conductive pastes, indium, and bismuth.

16. The method of claim 13, wherein coupling the intra-conductor insulating structure to the package surface comprises dispensing one or more non conductive materials on the package surface using one or more dispensing methods selected from spraying, inkjet printing, aerosol jet printing, stencil printing, and needle dispense.

17. The method of claim 16, wherein the one or more non-conductive materials are selected from an epoxy, silicone, a cyanide ester, acrylic, and a polymer adhesive.

* * * * *